(12) United States Patent
Yoshida et al.

(10) Patent No.: US 8,570,252 B2
(45) Date of Patent: Oct. 29, 2013

(54) ORGANIC EL LIGHT EMITTING DEVICE

(75) Inventors: Hidehiro Yoshida, Osaka (JP); Kenji Okumoto, Kyoto (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 13/133,254

(22) PCT Filed: Oct. 22, 2009

(86) PCT No.: PCT/JP2009/005564
§ 371 (c)(1),
(2), (4) Date: Jun. 7, 2011

(87) PCT Pub. No.: WO2010/070800
PCT Pub. Date: Jun. 24, 2010

(65) Prior Publication Data
US 2011/0260955 A1   Oct. 27, 2011

(30) Foreign Application Priority Data

Dec. 18, 2008   (JP) .................................. 2008-322135

(51) Int. Cl.
*G09G 3/30* (2006.01)
*H01J 1/62* (2006.01)
*H01J 63/04* (2006.01)

(52) U.S. Cl.
USPC ............................................ 345/76; 313/504

(58) Field of Classification Search
None
See application file for complete search history.

(56) References Cited

U.S. PATENT DOCUMENTS 6,373,453 B1   4/2002   Yudasaka
6,380,672 B1   4/2002   Yudasaka (Continued)

FOREIGN PATENT DOCUMENTS

JP   11-65487 A   3/1999
JP   2004-146388 A   5/2004

(Continued)

OTHER PUBLICATIONS

International Search Report for PCT/JP2009/005564 dated Dec. 8, 2009.

(Continued)

*Primary Examiner* — Nicholas Lee
(74) *Attorney, Agent, or Firm* — Pearne & Gordon LLP

(57) ABSTRACT

An organic EL light emitting device is provided with: a substrate having a coloring region where two or more pixel regions are arranged in a line; line-shaped main banks which define the coloring region and face each other; pixel separation regions arranged among the pixel regions in the coloring region; a pixel electrode arranged for each of the pixel regions; and organic function layers arranged on the pixel electrodes. In the organic EL light emitting device, auxiliary banks, and grooves for communicating the pixel regions with each other are arranged in the pixel separation regions, and the projection of an end portion of a second pixel region side of a groove arranged in a pixel separation region (A) overlaps an auxiliary bank arranged in a pixel separation region (B) if the end portion thereof is projected from the first pixel region side to the second pixel region side in the line direction of the main banks when three successive pixel regions in the coloring region are set as the first pixel region, the second pixel region, and a third pixel region, and a pixel separation region between the first pixel region and the second pixel region is set as the pixel separation region (A), and a pixel separation region between the second pixel region and the third pixel region is set as the pixel separation region (B).

7 Claims, 20 Drawing Sheets

U.S. PATENT DOCUMENTS

| | | |
|---|---|---|
| 7,091,660 B2 | 8/2006 | Park et al. |
| 2002/0060518 A1 | 5/2002 | Duineveld et al. |
| 2002/0075207 A1 | 6/2002 | Yudasaka |
| 2003/0206144 A1 | 11/2003 | Yudasaka |
| 2004/0229139 A1 | 11/2004 | Tanaka et al. |
| 2007/0075618 A1 | 4/2007 | Mitsuya |
| 2008/0036374 A1* | 2/2008 | Okano .......... 313/506 |
| 2008/0036699 A1 | 2/2008 | Yudasaka |
| 2009/0160322 A1 | 6/2009 | Yoshida et al. |
| 2009/0284135 A1 | 11/2009 | Yoshida et al. |
| 2009/0284146 A1 | 11/2009 | Yoshida et al. |

FOREIGN PATENT DOCUMENTS

| | | |
|---|---|---|
| JP | 2004-268028 A | 9/2004 |
| JP | 2004-288403 A | 10/2004 |
| JP | 2007-95614 A | 4/2007 |
| JP | 2007-227127 A | 9/2007 |
| JP | 2009-63875 A | 3/2009 |
| JP | 2009-129605 A | 6/2009 |
| WO | 99/10862 A1 | 3/1999 |
| WO | 02-41400 A1 | 5/2002 |
| WO | 2008/149498 A1 | 12/2008 |
| WO | 2008/149499 A1 | 12/2008 |
| WO | 2008146470 A1 | 12/2008 |

OTHER PUBLICATIONS

Supplementary European Search Report for Application No. 09833110.1-1235 / 2360995 dated Jan. 2, 2013.

* cited by examiner

ORGANIC EL LIGHT EMITTING DEVICE

TECHNICAL FIELD

The present invention relates to an organic EL light-emitting device.

BACKGROUND ART

The organic EL light-emitting device is a light-emitting device using electroluminescence of organic compound. The organic EL light-emitting device has sub-pixels (pixel regions) arranged on a substrate in a matrix arrangement, each having an organic light-emitting layer emitting red (R), green (G) or blue (B) light.

Organic compounds contained in the organic light-emitting layer producing electroluminescence are classified roughly into combinations of low-molecular organic compounds (host material and dopant material) and high-molecular organic compounds. Examples of high-molecular organic compounds producing electroluminescence include polyphenylene vinylene called PPV and derivatives thereof. The organic EL light-emitting device containing high-molecular organic compounds is driven at a relatively low voltage, consumes low electric power, and can provide a larger display screen. Accordingly, the organic EL light-emitting device using high-molecular organic compounds is actively researched these days.

For example, the organic light-emitting layer containing high-molecular organic compounds is formed by applying a material liquid containing an organic light-emitting material and a solvent onto a pixel electrode by the inkjet printing or other technique. Therefore, when ink containing an organic light-emitting material is applied to respective sub-pixels for the manufacture of an organic EL light-emitting device, it is necessary to prevent the ink from entering into a sub-pixel emitting a different color.

A method for applying ink to a color emission region is known. In this method, in order to prevent the ink from entering into a sub-pixel emitting a different color, a region having sub-pixels emitting the same color of light arranged in one row (hereinafter also referred to as a "color emission region") is defined by a linear partition wall (bank), whereby the ink is applied to the color emission region (for example, see patent literature 1).

In the method for applying ink to a color emission region defined by linear banks as disclosed in patent literature 1, ink can freely move across the color emission region. Therefore, the organic light-emitting layer of a sub-pixel in the color emission region is leveled, and thereby the thickness of the organic light-emitting layer becomes uniform among the sub-pixels. This provides an organic EL light-emitting device with little brightness variation among pixels.

However, unless there is a barrier for separating sub-pixels in the color emission region as in the method disclosed in patent literature 1, it poses a problem that cross talk occurs between the sub-pixels in the color emission region, which reduces the contrast of the organic EL light-emitting device.

As a known method for solving the above problem, a second partition wall is arranged between sub-pixels in a color emission region (for example, see patent literature 2). FIG. 1 is a top view illustrating an organic EL light-emitting device disclosed in patent literature 2.

As shown in FIG. 1, the light-emitting device disclosed in patent literature 2 includes first partition walls 5 defining color emission regions, and second partition walls 7 arranged between sub-pixels 3 in the color emission regions. Further, adjacent sub-pixels 3 in the color emission region are connected via grooves 8 (a region in which no second partition wall is formed) formed between the first partition wall and the second partition wall.

By providing the second partition wall between adjacent sub-pixels in the color emission region in this way, crosstalk between the sub-pixels is reduced, whereby the contrast of the light-emitting device can be improved. Further, since the adjacent sub-pixels are connected via grooves, a material liquid applied in the color emission region can move between the adjacent sub-pixels, and thereby the thickness of the organic light-emitting layer becomes uniform among sub-pixels. As described above, according to the invention described in patent literature 2, not only the crosstalk can be reduced but also the the organic light-emitting layer can be leveled.

The organic light-emitting layer is formed by the coating method in a clean room, but it is impossible to completely rid the clean room of foreign substances such as particles derived from the surrounding environment and organic light-emitting layer production equipment. Therefore, foreign substances may be mixed in the sub-pixel during the steps for producing the organic EL light-emitting device.

A technique for making protrusions on a linear bank in order to prevent ink from entering into an adjacent color emission region is known (for example, see patent literature 3). The organic EL light-emitting device disclosed in patent literature 3 is a passive matrix type, in which a bank functions as a separator for a counter electrode.

In the active matrix type organic EL light-emitting device, a method for forming a groove in a bank in order to prevent a counter electrode from being divided by the bank is known (for example, see patent literatures 4 to 9). In the organic EL light-emitting devices disclosed in patent literatures 4 to 9, each sub-pixel is independently arranged on the organic light-emitting layer.

CITATION LIST

Patent Literature

PTL 1
U.S. Pat. No. 7,091,660
PTL 2
Japanese Patent Application Laid-Open No. 2007-227127
PTL 3
Japanese Patent Application Laid-Open No. 2004-288403
PTL 4
Japanese Patent Application Laid-Open No. 11-65487
PTL 5
Japanese Patent Application Laid-Open No. 2004-146388
PTL 6
U.S. Pat. No. 6,373,453
PTL 7
United States Patent Application Publication No. 2002/0075207
PTL 8
United States Patent Application Publication No. 2003/0206144
PTL 9
United States Patent Application Publication No. 2008/0036699

SUMMARY OF INVENTION

Technical Problem

However, when a foreign substance adheres to a sub-pixel in the light-emitting device disclosed in patent literature 2, material liquid applied in the color emission region is absorbed by the foreign substance. This makes the film thickness of the organic light-emitting layer non-uniform, and in addition, a region without any organic light-emitting layer may be generated.

FIG. 2A is a partially enlarged diagram illustrating a light-emitting device disclosed in patent literature 2, which is shown in FIG. 1. In FIG. 2A, reference sign 15 denotes foreign substance. In FIG. 2A, arrows Y denote the movement of a material liquid of the organic light-emitting layer, applied in a color emission region. When the material liquid of the organic light-emitting layer is applied to the color emission region including sub-pixel 3c with foreign substance 15, ink passes through groove 8 formed between first partition wall 5 and second partition wall 7, and is absorbed by foreign substance 15. Accordingly, the material liquids applied to sub-pixel 3a and sub-pixel 3b is drawn into sub-pixel 3c.

FIG. 2B is a cross sectional view taken along line AA of the light-emitting device as shown in FIG. 2A. As shown in FIG. 2B, the material liquids are drawn into sub-pixel 3c. Thus, the thickness of organic light-emitting layer 9 increases in sub-pixel 3c. The thickness of organic light-emitting layer 9 decreases in sub-pixel 3b. In sub-pixel 3a, a region without organic light-emitting layer 9 is also generated.

Therefore, when a foreign substance adheres to a sub-pixel in the organic EL light-emitting device disclosed in patent literature 2, the thickness of the organic light-emitting layer differs among sub-pixels, and therefore brightness varies between among sub-pixels. When the brightness among sub-pixels varies greatly in the organic EL light-emitting device, the organic EL light-emitting device is determined to be a defective device in an examination step. Therefore, there is a problem in that the organic EL light-emitting device disclosed in patent literature 2 has low yields.

It may be possible to lengthen groove 8 so that the material liquid is less likely to flow between sub-pixels and the material liquid is less absorbed by foreign substance. However, when the length of groove 8 is increased, it is necessary to increase length 7w of the second partition wall in the longitudinal direction of the color emission region (interval between sub-pixels). Therefore, when groove 8 is lengthened, the size of an area of a non-color emission region in between adjacent sub-pixels is increased, and the size of an area of light emission per unit area (aperture ratio) is reduced in the organic EL light-emitting device.

As described above, it has been difficult to level the thickness of the organic light-emitting layer among sub-pixels while maintaining a high aperture ratio, and at the same time, prevent a foreign substance from absorbing the material liquid.

An object of the present invention is to provide an organic EL light-emitting device having a high aperture ratio, wherein even when a foreign substance is mixed in, the thickness of the organic light-emitting layer is uniform among pixel regions.

Solution to Problem

The present invention relates to an organic EL light-emitting device described below.

[1] An organic EL light-emitting device including:
a substrate having a color emission region, the color emission region having two or more pixel regions arranged in one row;
linear main banks for defining the color emission region, the main banks opposing each other;
a pixel isolation region arranged between each of the pixel regions in the color emission region;
a pixel electrode arranged for each of the pixel regions; and
an organic function layer arranged over the pixel electrode,
wherein the pixel isolation region includes an auxiliary bank and a groove, the groove for making the pixel regions in communication with each other, and
wherein, when the pixel regions includes a first pixel region, a second pixel region, and a third pixel region, the first, second and third pixel regions arranged consecutively; when the pixel isolation region between the first pixel region and the second pixel region is defined as pixel isolation region A, and the pixel isolation region between the second pixel region and the third pixel region is defined as pixel isolation region B; and when an end portion of the groove arranged in the pixel isolation region A at the second pixel region side is projected from the first pixel region to the second pixel region in a line direction of the main bank,
the projection of the end portion overlaps the auxiliary bank in the pixel isolation region B.

[2] The organic EL light-emitting device according to [1], wherein each of the pixel isolation regions includes one auxiliary bank,
the auxiliary bank arranged on the pixel isolation region A is connected only to one of the opposing main banks, and the auxiliary bank arranged on the pixel isolation region B is connected only to the other of the opposing main banks, and
a length of the auxiliary bank arranged in each of the pixel isolation regions in a direction perpendicular to the line direction is equal to or larger than ½ of a length of the color emission region in a minor axis direction.

[3] The organic EL light-emitting device according to [1], wherein each of the pixel isolation regions includes a first auxiliary bank and a second auxiliary bank, the first auxiliary bank is connected only to one of the opposing main banks, and the second auxiliary bank is connected only to the other of the opposing main banks, a position of the first auxiliary bank in the line direction is different from a position of the second auxiliary bank in the line direction, and a length of the first auxiliary bank and the second auxiliary bank in a direction perpendicular to the line direction is equal to or larger than ½ of a length of the color emission region in a minor axis direction.

[4] The organic EL light-emitting device according to [1], wherein each of the pixel isolation regions includes a first auxiliary bank, a second auxiliary bank, and a third auxiliary bank,
the first auxiliary bank is connected only to one of the opposing main banks, and the second auxiliary bank is connected only to the other of the opposing main banks,
the first auxiliary bank and the second auxiliary bank are opposing each other,
the groove is arranged between the first auxiliary bank and the second auxiliary bank,
a position of the third auxiliary bank in the line direction is different from positions of the first auxiliary bank and the second auxiliary bank in the line direction, and
a position of the third auxiliary bank in a direction perpendicular to the line direction overlaps a position of the groove arranged between the first auxiliary bank and the second auxiliary bank.

[5] The organic EL light-emitting device according to any one of [1] to [4], wherein a height of the auxiliary bank is 0.05 to 1.0 times a height of the main banks.

[6] The organic EL light-emitting device according to any one of [1] to [5], wherein a hole injection layer is arranged between the pixel electrode and the organic function layer, and a material of the hole injection layer is a transition metal oxide.

[7] The organic EL light-emitting device according to [6], wherein the transition metal oxide is selected from a group consisting of $WO_x$, $MoO_x$, $TiO_2$, $NiO$, $V_2O_5$ and $RuO_2$.

Advantageous Effects of Invention

According to the present invention, an organic EL light-emitting device having a high aperture ratio is provided, wherein the thickness of the organic light-emitting layer is uniform among pixel regions.

DESCRIPTION OF EMBODIMENTS

Figure 1:
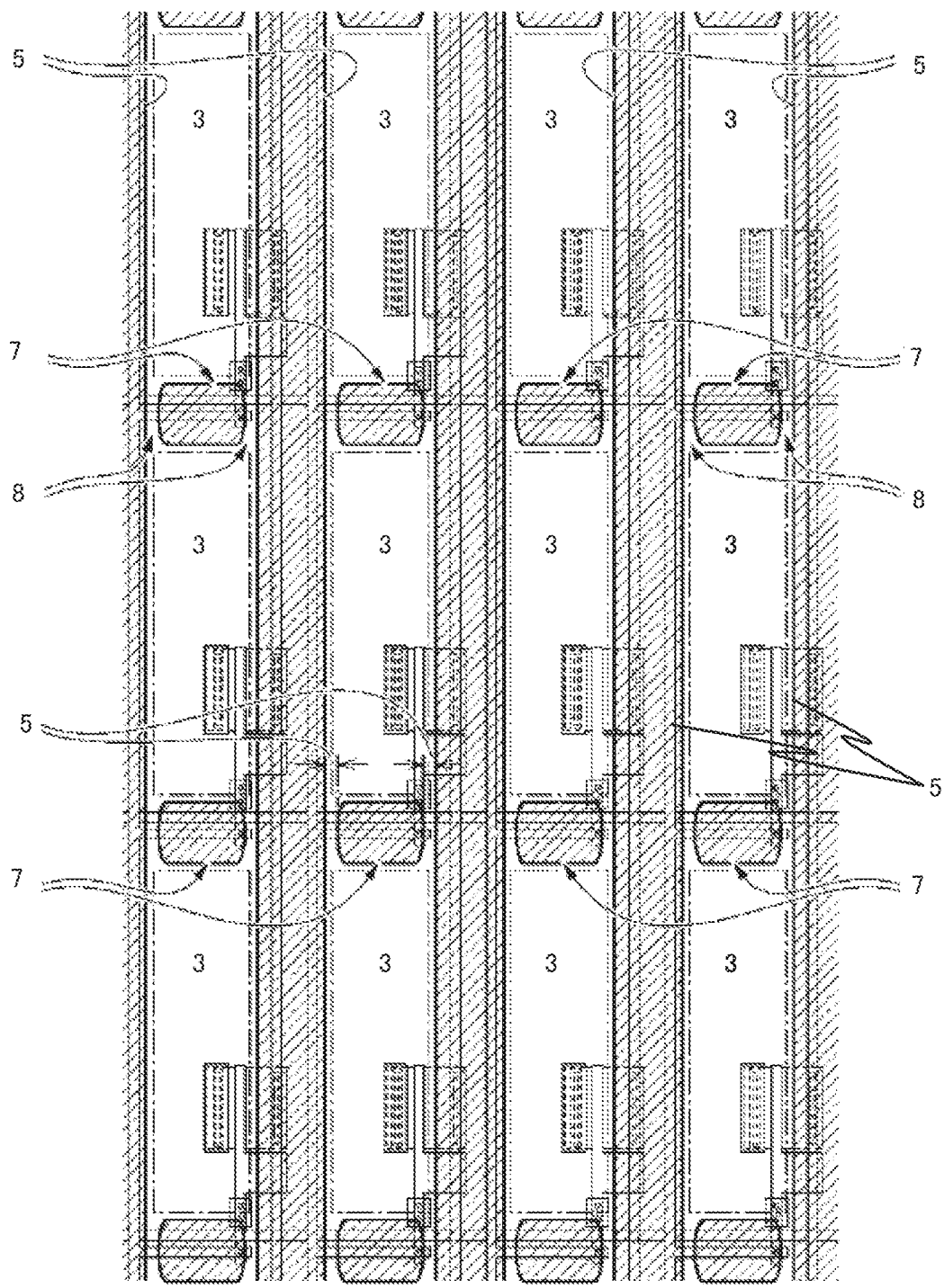
FIG. 1 is a top view illustrating a conventional organic EL light-emitting device.

1. Organic EL Light-Emitting Device According to the Present Invention

The organic EL light-emitting device according to the present invention includes 1) a substrate, 2) a pixel electrode, 3) a main bank, 4) a pixel isolation region, 5) an organic function layer, and 6) a counter electrode. As will be described later, according to the present invention, even when a foreign substance adheres to a pixel region, a material liquid of an organic function layer can be prevented from being absorbed by the foreign substance. Therefore, the present invention achieves effects especially in an organic EL light-emitting device having a large screen. When an organic EL light-emitting device having a large screen is manufactured, it is highly possible that foreign substance such as particles come into pixel regions, and it is very much necessary for the present invention to prevent a material liquid from being absorbed by the foreign substance. The components of the organic EL light-emitting device according to the present invention will be hereinafter described.

1) Substrate

The substrate has color emission regions. The color emission regions are usually linear. The color emission regions are arranged in parallel to one another so that the longitudinal axes of the color emission regions run along a particular direction. In each of the color emission regions, two or more pixel regions are arranged in one row. As used herein, the "pixel region" means a region in which a sub-pixel emitting light of red (R), green (G), or blue (B) is formed. In other words, in the present invention, three kinds of color emission regions (R, G, and B) are arranged in parallel to one another. For example, a green color emission region is arranged adjacent to a red color emission region, a blue color emission region is arranged adjacent to the green color emission region, and a red color emission region is arranged adjacent to the blue color emission region.

The material of the substrate is different according to whether the organic EL light-emitting device is of the bottom emission type or top emission type. For example, when the organic EL light-emitting device is of the bottom emission type, the substrate is required to be transparent. Therefore, when the organic EL light-emitting device is of the bottom emission type, examples of materials of substrates include glass, quartz, transparent plastic, and the like. On the other hand, when the organic EL light-emitting device is of the top emission type, the substrate is not required to be transparent. Therefore, when the organic EL light-emitting device is of the top emission type, the substrate may be made of any material as long as it is an insulating material. Examples of materials of substrates include opaque plastics and metals.

The substrate may have metal interconnection and thin-film transistors (TFTs) for driving sub-pixels. A source electrode or a drain electrode of a TFT is connected to a pixel electrode, which will be described later.

2) Pixel Electrode

In each pixel region, a pixel electrode is arranged. The pixel electrode is a conductive member arranged on the substrate. The pixel electrode usually functions as an anode, but the pixel electrode may function as a cathode. The pixel electrode is arranged in each pixel region. When the organic EL light-emitting device is of the passive matrix type, a plurality of linear pixel electrodes are arranged on the substrate. The linear pixel electrodes are preferably in parallel to one another. On the other hand, when the organic EL light-emitting device is of the active matrix type, the pixel electrode is independently arranged in each pixel region.

In the bottom emission type organic EL light-emitting device, the pixel electrode is required to be a transparent electrode. Examples of materials of these pixel electrodes include ITO (indium tin oxide), IZO (indium zinc oxide), and ZnO (zinc oxide). In the top emission type organic EL light-emitting device, the pixel electrode is required to have light reflection property. Examples of materials of these pixel electrodes include alloys containing silver. More specifically, examples of materials of these pixel electrodes include aluminum alloys such as silver-palladium-copper alloy (also referred to as "APC"), silver-ruthenium-gold alloy (also referred to as "ARA"), MoCr (chrome molybdenum), NiCr (nickel chrome), and aluminum-neodymium alloy (also referred to as "Al—Nd"). Further, on the surface of the reflective pixel electrode, an ITO film and an IZO film (Indium Zinc Oxide) may be arranged.

A hole injection layer may be arranged on the pixel electrode. The hole injection layer has a function to assist injection of holes into an organic functional layer, which is described below, from the pixel electrode. Therefore, the hole injection layer is positioned between the pixel electrode and the organic functional layer.

Materials of the hole injection layer include polystyrenesulfonate doped-poly (3,4-ethylenedioxythiophene) (referred to as "PEDOT-PSS"), its derivatives (such as a copolymer), transition metal oxides, and the like.

Examples of transition metal oxides include WOx, $MoO_x$, $TiO_2$, NiO, $V_2O_5$, $RuO_2$, and combinations thereof. A preferable material of the hole injection layer is tungsten oxide ($WO_x$) or molybdenum oxide ($MoO_x$). The thickness of the hole injection layer is typically, 10 to 100 nm, which may be about 50 nm.

The material of the hole injection layer is preferably a transition metal oxide. This is because the hole injection layer containing PEDOT-PSS is formed by the coating method, and therefore, the layer may have uneven film thickness. In addition, the hole injection layer including PEDOT-PSS is conductive, which may result in short-circuit between pixels. On the other hand, a hole injection layer made of transition metal oxide can be formed by sputtering or vapor deposition, which produces a uniform film thickness.

In addition, as long as holes can be efficiently injected from a pixel electrode into an organic function layer, the hole injection layer may be omitted. In this case, the organic function layer is directly formed on the pixel electrode.

3) Main Bank

The main bank defines the above linear color emission region. One color emission region is defined by two main banks opposing each other. A plurality of linear main banks running in parallel to one another is arranged on the substrate. When the pixel electrodes are formed in a line (when the organic EL light-emitting device is a passive matrix-type), the direction of the line of the linear main banks is preferably perpendicular to the direction of the line of the pixel electrodes. When the organic EL light-emitting device according to the present invention is of the passive matrix type, the main bank functions as a counter electrode separator.

The height of the main bank, as measured from the surface of the substrate, is preferably 0.5 to 3 µm. More particularly, the height is preferably 0.8 µm to 1.2 µm. When the height of the bank is less than 0.5 µm, ink applied to a region defined by the banks may flow over the banks.

The material of the main bank has high lyophobicity. More specifically, the contact angle of water on the surface of the main bank is preferably 60 degrees or more. In order to increase the lyophobicity of the main bank, the surface of the main bank may be subjected to plasma treatment using fluorine gas, or the material of the main bank may contain fluorine-containing resin.

Examples of fluorine compounds included in the fluorine-containing resin include fluorinated resins such as vinylidene fluoride, vinyl fluoride, trifluoroethylene, and copolymers thereof. Examples of resins included in the fluorine-containing resin include phenol-novolac resins, polyvinyl phenol resins, acrylic resins, methacrylate resins, and combinations thereof.

As mentioned above, in the passive matrix type organic EL light-emitting device, the main bank functions as a counter electrode separator. When the organic EL light-emitting device is of the passive matrix type, the shape of the main bank preferably has a reverse tapered shape. When the shape of the main bank has a reverse tapered shape, the counter electrode formed by deposition is likely to be segmented.

On the other hand, when the organic EL light-emitting device is of the active matrix type, all of the sub-pixels share one counter electrode. Therefore, in the active matrix type organic EL light-emitting device, the shape of the main bank is preferably a forward tapered shape. This is because when the shape of the bank is the forward tapered shape, the counter electrode is not segmented even when the counter electrode is thin.

4) Pixel Isolation Region

A pixel isolation region is disposed between pixel regions. The pixel isolation region means a non-luminous region between the pixel regions. The pixel isolation region is provided with an auxiliary bank and a groove allowing communication between pixel regions. The pattern of the groove is not particularly limited as long as the effects of the present invention are not lost.

One or more than one auxiliary banks may be arranged in each pixel isolation region. The height of the auxiliary bank from the surface of the substrate is preferably smaller than the height of the main bank from the surface of the substrate. The height of the auxiliary bank is preferably 0.05 to 1 times larger than the height of the main bank. As described above, when the height of the auxiliary bank is smaller than the height of the main bank, the material liquid of the organic function layer applied to one color emission region is prevented from entering into adjacent color emission regions.

The wettability of the auxiliary bank is preferably higher than that of the main bank. When the wettability of the auxiliary bank is higher than that of the main bank, the thickness of the organic function layer formed by the coating method in the color emission region can be made uniform. The present invention is characterized in the structures of the auxiliary bank and the groove arranged in the pixel isolation region. The structure of the auxiliary bank and the groove will be hereinafter described in detail with reference to the drawings.

Figure 3:
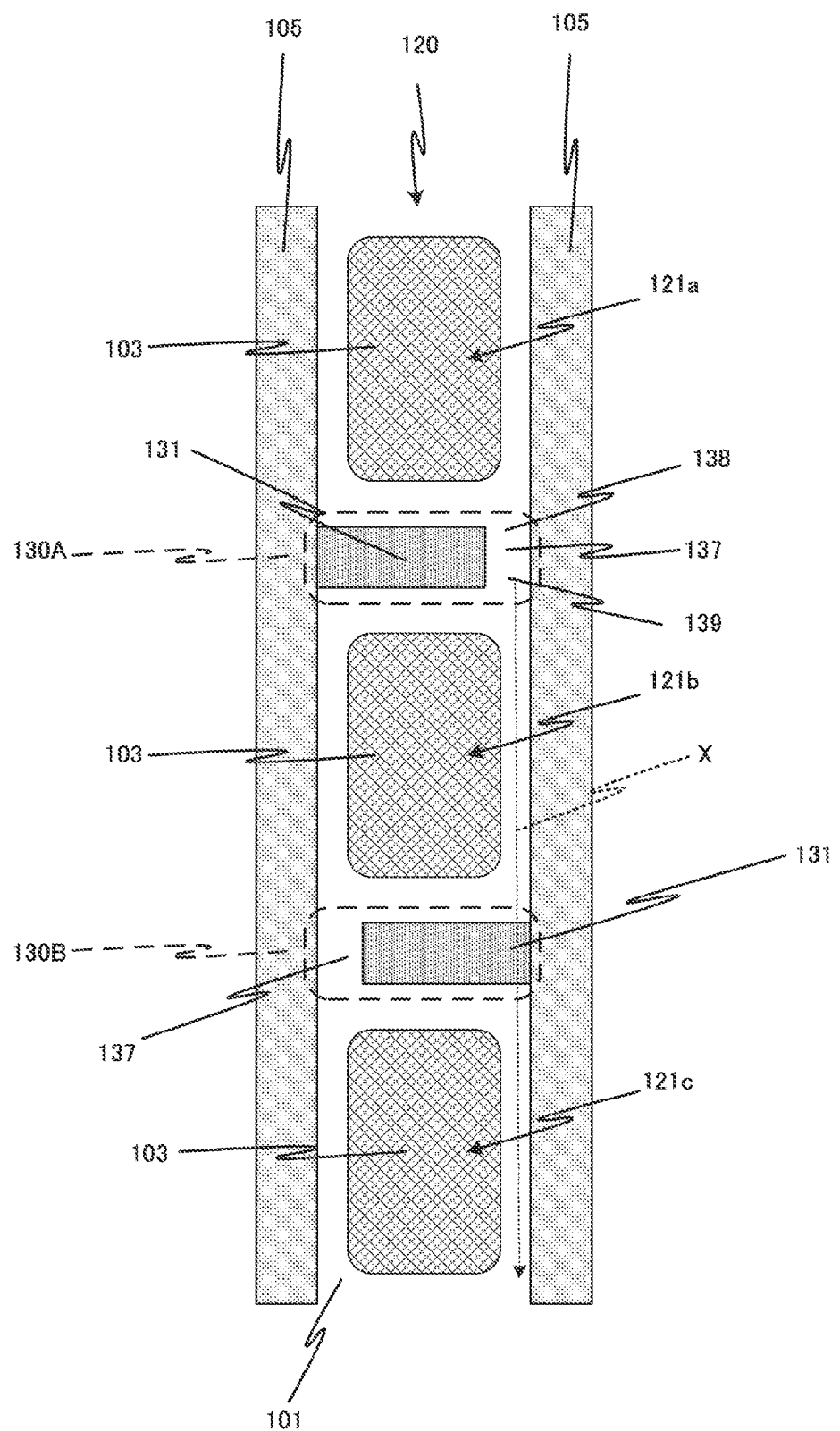
FIG. 3 is a partially enlarged top view illustrating an organic EL light-emitting device according to the present invention.

FIG. 3 is an enlarged view illustrating a color emission region in an organic EL light-emitting device according to the present invention in which an organic function layer is not provided. The organic EL light-emitting device as shown in FIG. 3 includes substrate 101, pixel electrode 103 arranged on substrate 101, and main bank 105 arranged on substrate 101. Substrate 101 includes color emission region 120. Color emission region 120 includes three pixel regions (first pixel region 121a, second pixel region 121b, and third pixel region 121c), which are arranged consecutively in one row.

Pixel isolation region 130A is arranged between first pixel region 121a and second pixel region 121b. Pixel isolation region 130B is arranged between second pixel region 121b and third pixel region 121c. The pixel isolation regions (130A, 130B) are each provided with auxiliary bank 131 and groove 137. Groove 137 arranged in pixel isolation region 130A includes end portion 138 at first pixel region 121a side and end portion 139 at second pixel region 121b side. Line X represents a region in which a projection of end portion 139 appears (hereinafter simply referred to as "the projection of end portion 139") when end portion 139 is projected from first pixel region 121*a* to second pixel region 121*b* in a line direction of the linear main bank 105.

The present invention is characterized in the positional relationship between groove 137 in pixel isolation region 130A and auxiliary bank 131 in pixel isolation region 130B. More specifically, as shown in FIG. 3, in the organic EL light-emitting device according to the present invention, the projection of end portion 139 of groove 137 in pixel isolation region 130A is arranged to overlap auxiliary bank 131 in pixel isolation region 130B.

As described above, in the present invention, the projection of end portion 139 of groove 137 in pixel isolation region 130A is arranged to overlap the auxiliary bank in pixel isolation region 130B. Accordingly, during manufacturing of the organic EL light-emitting device, even when a foreign substance such as particles adheres to the color emission region, the material liquid of the organic function layer can be prevented from being absorbed by the foreign substance. A mechanism for preventing a material liquid from being absorbed by a foreign substance according to the present invention will be hereinafter described in detail in the section "2. Method for manufacturing organic EL light-emitting device according to the present invention."

5) Organic Function Layer

The organic function layer includes at least an organic light-emitting layer. The organic function layer is formed by the coating method on the hole injection layer or the pixel electrode in each pixel region. The organic function layer formed in each pixel region in the color emission region is in communication with each other via a groove arranged in the pixel isolation region.

The thickness of the organic light-emitting layer included in the organic function layer is 50 to 100 nm, and may be about 70 nm. The organic EL material included in the organic light-emitting layer is appropriately selected for each sub-pixel according to colors (R, G, and B) of lights emitted from the sub-pixels. The organic EL material may be either a high-molecular organic EL material or a low-molecular organic EL material. However, from the viewpoint of forming the organic light-emitting layer by the coating method, the high-molecular organic EL material is more preferable. The reason why the high-molecular organic EL material is used is that the organic light-emitting layer can be easily formed without damaging other members. Examples of high-molecular organic EL materials include polyphenylene vinylene and its derivatives, polyacetylene and its derivatives, polyphenylene (PP) and its derivatives, polyparaphenylene ethylene and its derivatives, poly-3-hexylthiophene (P3HT) and its derivatives, polyfluorene (PF) and its derivatives, and the like. Examples of low-molecular organic EL materials include tris (8-hydroxyquinolinato) aluminum and the like.

The organic functional layer may have, in addition to the organic light-emitting layer, a hole transport layer (interlayer), an electron injection layer, and an electron transport layer.

The hole transport layer is arranged between the pixel electrode and the organic light-emitting layer. The hole transport layer has a function of efficiently transporting holes to the organic light-emitting layer, and also has a function of blocking entry of electron into the pixel electrode (or the hole injection layer). The material of the hole transport layer may be either a high-molecular material or a low-molecular material as long as the material of the hole transport layer is an organic material capable of transporting holes. Examples of hole transport materials include copolymers containing a fluorene moiety and triarylamine moiety, and triarylamine derivatives of low molecular weight.

When ink containing the organic light-emitting material is applied to the hole transport layer, the hole transport material in the hole transport layer is preferably cross-linked so as to prevent elution of the hole transport layer to ink. The hole transport materials can be cross-linked by adding a cross-linking agent to the material liquid of the hole transport layer. Examples of cross-linking agents include dipentaerythritol hexaacrylate. The thickness of the hole transport layer is not particularly limited. For example, the thickness of the hole transport layer is about 5 to 100 nm, and more particularly, it is about 20 nm.

6) Counter Electrode

The organic EL light-emitting device according to the present invention includes a counter electrode on the organic function layer. The counter electrode usually functions as a cathode, but may also function as an anode.

In the passive matrix type organic EL light-emitting device, the counter electrode is independently arranged for each color emission region. On the other hand, in the active matrix type organic EL light-emitting device, each sub-pixel is independently controlled by a TFT and, therefore, one counter electrode is shared by all of the sub-pixels.

The material of the counter electrode is different according to whether the organic EL light-emitting device is of the bottom emission type or top emission type. In the case of top emission type, the counter electrode needs to be transparent. Accordingly, an example of a counter electrode is preferably a conductive member having a transmittance of 80% or more. Therefore, the top emission organic EL light-emitting device having a high luminous efficiency can be obtained.

The above transparent cathode may be composed of a layer containing an alkaline earth metal, a layer containing organic material having electron transport property, and a metal oxide layer. Examples of the alkaline earth metals include magnesium, calcium, and barium. For example, the organic material having electron transportation property is an organic semiconductor material having electron transportation property. The metal oxides are not particularly limited. For example, metal oxides are indium zinc oxide or indium tin oxide.

The transparent cathode may be composed of a layer containing silver and a layer containing an alkali metal, alkaline earth metal or halide thereof. The layer containing silver may be composed only of silver, or may be composed of silver alloy. A refractive index adjustment layer having a high transparency may be arranged on the layer including silver. The refractive index adjustment layer can improve the light extraction efficiency.

The organic EL light-emitting device according to the present invention may have a cover member on the counter electrode. The cover member can prevent entry of oxygen and moisture.

2. Method for Manufacturing Organic EL Light-Emitting Device According to the Present Invention The method for manufacturing the above organic EL light-emitting device according to the present invention includes: 1) a first step of providing a panel on which an organic function layer is not yet formed; and 2) a second step of forming an organic function layer by applying a material liquid of the organic function layer to the panel. Each of the steps will be hereinafter described.

1) First Step

In the first step, the panel on which an organic function layer is not yet formed is provided. The panel provided in the first step has the above substrate and the main bank.

As described above, the substrate has color emission regions each having a plurality of pixel regions arranged in one row. The color emission regions are defined by the banks.

Further, the auxiliary bank and the groove are arranged in the pixel isolation region arranged between the pixel regions. The pixel regions are in communication with each other via a groove. In each pixel region, a pixel electrode is arranged.

The main bank and the auxiliary bank are formed by, for example, intaglio printing method or photolithography that includes an exposure/development process. When the main bank and the auxiliary bank are formed by the intaglio printing method in particular, other members (pixel electrodes) and the like are less likely to be damaged.

2) Second Step

In the second step, the organic function layer is formed by applying a material liquid of the organic function layer (hereinafter also referred to as a "material liquid") to the panel provided in the first step. The material liquid preferably contains high-molecular organic light-emitting material. The high-molecular organic light-emitting material is appropriately selected so that desired color emission (R, G, and B) is generated from the color emission region.

More specifically, in the second step, the material liquid of the organic function layer is applied in a line form for each color emission region defined by the main banks. Therefore, the material liquid also adheres onto the auxiliary bank arranged in the pixel isolation region. Accordingly, when the height of the auxiliary bank is the same as the height of the main bank, the material liquid adhered onto the auxiliary bank may move over the main bank to enter into adjacent color emission regions. In the present invention, however, the height of the auxiliary bank is smaller than the height of the main bank as described above. With this configuration, the material liquid adhered onto the auxiliary bank is not allowed to move over the main banks. Therefore, the material liquid is less likely to enter into adjacent color emission regions.

Figure 2A:
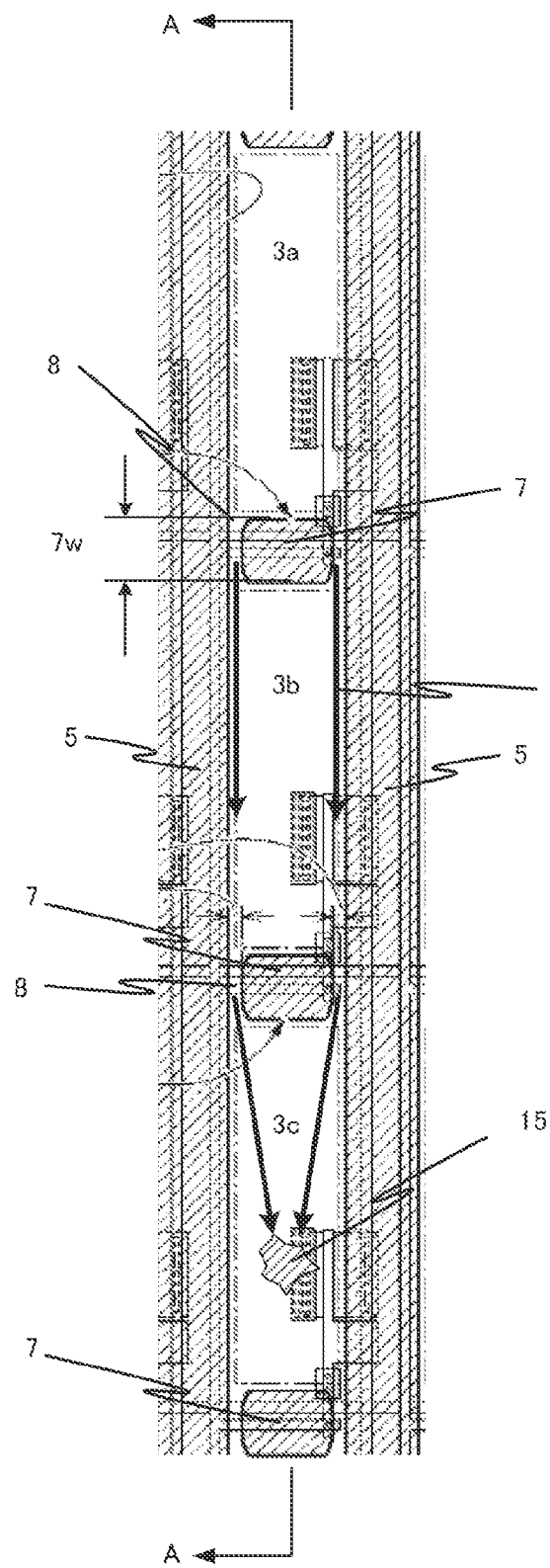
FIGS. 2A and 2B are a top view and a cross sectional view illustrating a conventional organic EL light-emitting device.
Figure 2B:
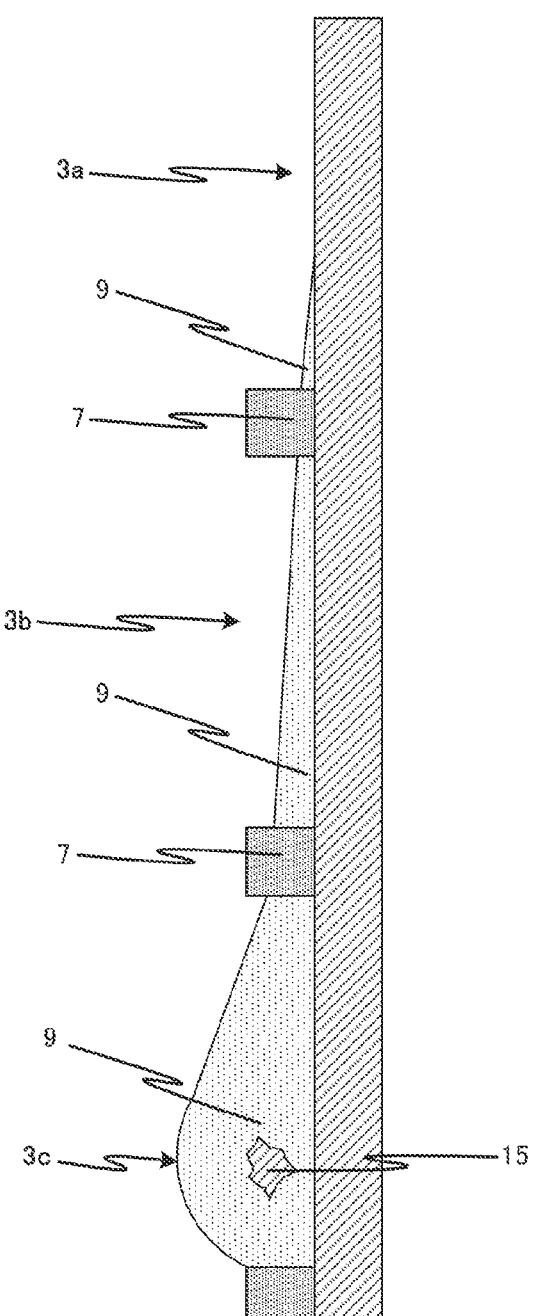

Although the second step is performed in a clean room, it is impossible to completely remove foreign substances such as particles given from the surrounding environment and organic light-emitting layer manufacturing equipment. Therefore, foreign substance may be mixed in the color emission region during the steps for producing the organic EL light-emitting device. When the foreign substance is mixed in the color emission region, the material liquid of the organic function layer applied to the color emission region may be absorbed by the foreign substance. This makes the film thickness non-uniform among the pixel regions, and a pixel region in which no organic function layer is formed may be generated (see FIG. 2B).

On the other hand, according to the present invention, the projection of end portion 139 of groove 137 in pixel isolation region A is arranged to overlap the auxiliary bank in pixel isolation region 130B as described above. With this configuration, ink is less likely to be absorbed by foreign substance. Behavior of ink according to the present invention will be hereinafter described with reference to the drawings, describing how the ink behaves when the material liquid of the organic function layer is applied to a color emission region into which foreign substance is mixed.

Figure 4:
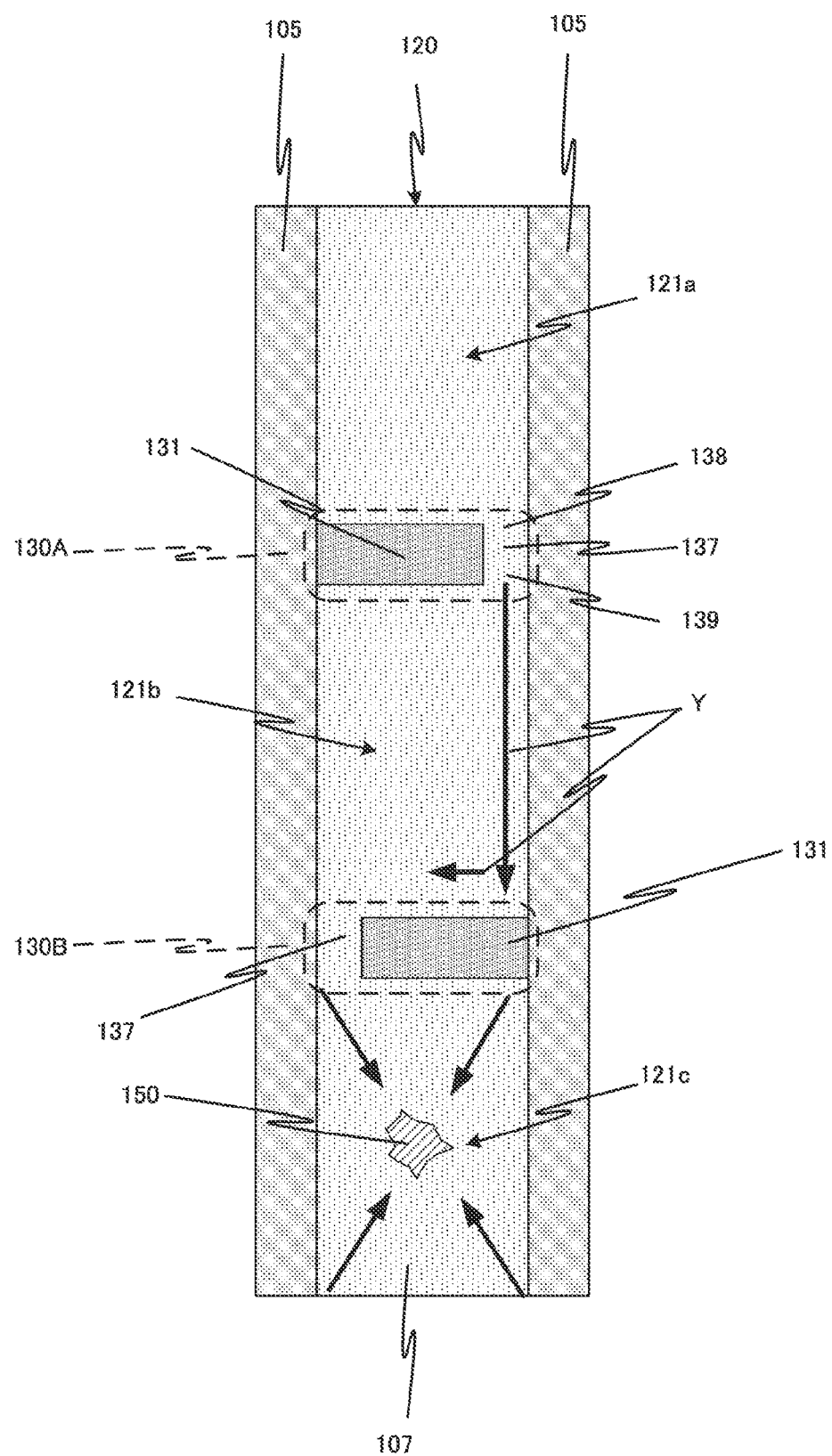
FIG. 4 is a partially enlarged top view illustrating the organic EL light-emitting device according to the present invention.

FIG. 4 shows a material liquid of organic function layer 107 applied to color emission region 120 into which foreign substance 150 is mixed in. The same constituent members as those of the organic EL light-emitting device as shown in FIG. 3 are denoted by the same reference signs, and description thereof will not be repeated here.

As shown in FIG. 4, foreign substance 150 adheres to third pixel region 121c. As described above, foreign substance 150 absorbs material liquid 107, and accordingly, material liquid 107 applied to color emission region 120 is drawn to third pixel region 121c.

However, in an exemplary embodiment of the present invention, the projection of end portion 139 of groove 137 in pixel isolation region 130A is arranged to overlap the auxiliary bank in pixel isolation region 130B as described above. Therefore, material liquid 107 flowing from first pixel region 121a into second pixel region 121b bumps into auxiliary bank 131 of pixel isolation region 130B, which prevents material liquid 107 from flowing straight into third pixel region 121c.

As described above, the auxiliary bank can prevent material liquid from flowing straight through the color emission region, reducing the fluidity of the material liquid flowing from one pixel region to another. Therefore, it takes some time for the material liquid to move between pixel regions. This prevents the material liquid in the color emission region from being drawn into the pixel region with the foreign substance. Therefore, according to the present invention, even when a foreign substance is attached to a color emission region, the organic function layer shows uniform film thickness among pixel regions.

On the other hand, in the pixel region with the foreign substance, electric current may leak through the foreign substance during the operation of the organic EL light-emitting. Therefore, the pixel region with the foreign substance is preferably repaired by laser irradiation or the like.

According to an exemplary embodiment of the invention, even when the length of the pixel isolation region is reduced in the line direction of the color emission region, the following effect of the present invention can be achieved: "the material liquid is prevented from flowing straight, and the fluidity of the material liquid flowing between the pixel regions is reduced." In other words, in the present invention, even when the length of the pixel isolation region in the line direction of the main bank (hereinafter also referred to as "line direction"), i.e., the interval between adjacent pixel regions in the color emission region, is reduced, the material liquid is prevented from being absorbed by the foreign substance. Therefore, in an exemplary embodiment of the invention, the width of the non-color emission region between the pixel regions can be reduced, and the aperture ratio of the organic EL light-emitting device can be improved.

According to an exemplary embodiment of the invention, excessively high fluidity of the material liquid is suppressed in the color emission region, whereas the material liquid can freely move between nearby pixel regions by flowing through the groove of the pixel isolation region. Therefore, the film thickness of the organic function layer is leveled among the pixel regions.

As described above, according to an exemplary embodiment of the invention, not only the material liquid is prevented from being absorbed by the foreign substance, but also the film thickness of the organic function layer is leveled among the pixel regions, while high aperture ratio is maintained.

After the organic functional layer is formed, the electron injection transport layer, the counter electrode, and the like are laminated, and a sealing film, a glass substrate, and the like are further arranged. Thus, a display is manufactured.

Embodiments of the present invention will be hereinafter described with reference to the drawings.

Embodiment 1

In Embodiment 1, an active matrix type organic EL light-emitting device having one auxiliary bank in each pixel isolation region will be described. Therefore, the organic EL light-emitting device according to Embodiment 1 has a counter electrode shared by all the sub-pixels (hereinafter also referred to as a "common counter electrode").

Figure 5:
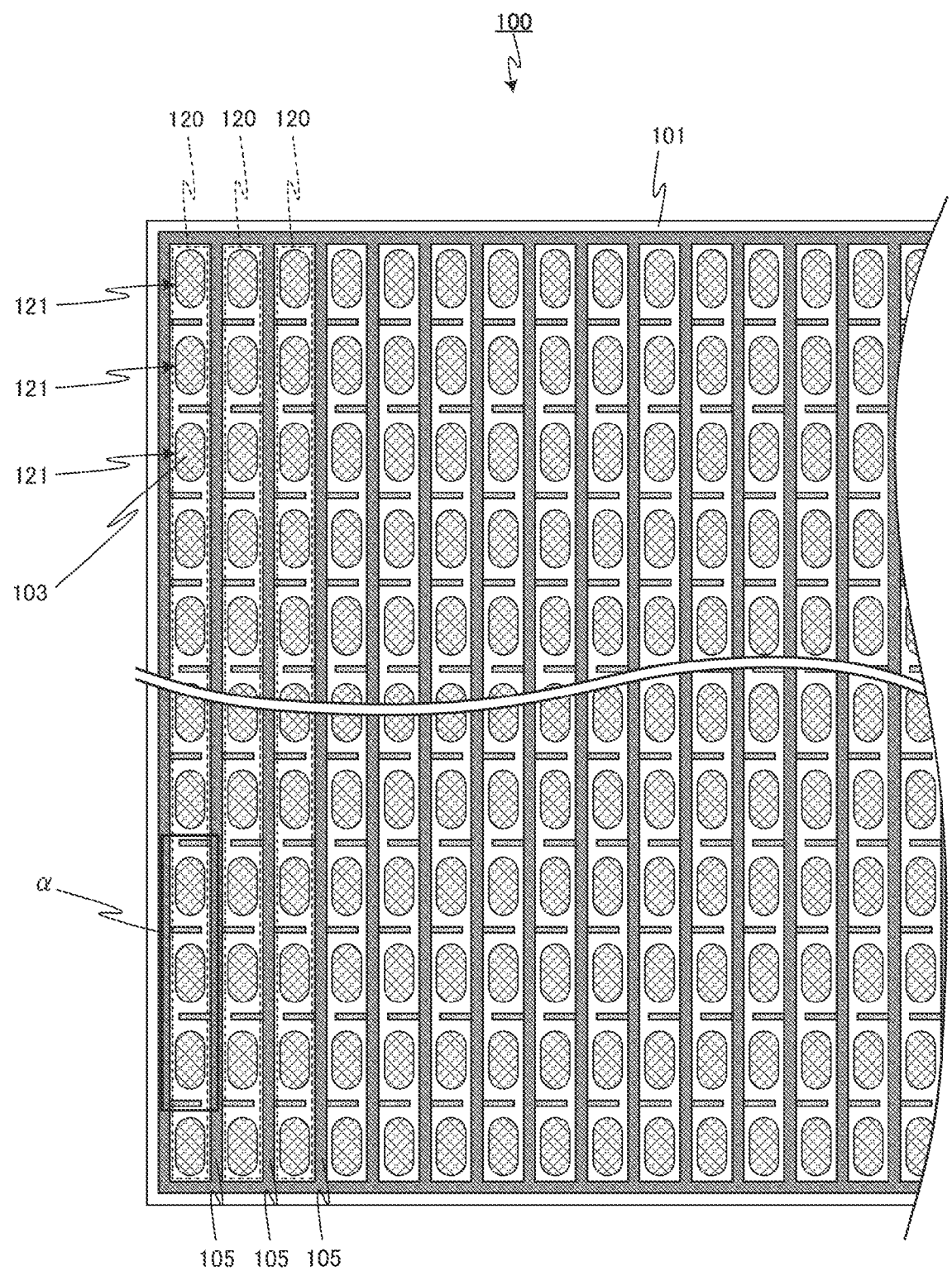
FIG. 5 is a top view illustrating an organic EL light-emitting device according to Embodiment 1.

FIG. 5 is a top view illustrating organic EL light-emitting device 100 according to Embodiment 1, in which the common counter electrode and the organic function layer are not illustrated. As shown in FIG. 5, organic EL light-emitting device 100 according to Embodiment 1 includes substrate 101 and linear main banks 105 provided on the substrate. Substrate 101 includes a plurality of color emission regions 120. In each color emission region 120, pixel regions 121 are arranged in one row. In each pixel region 121, pixel electrode 103 is provided.

Figure 6:
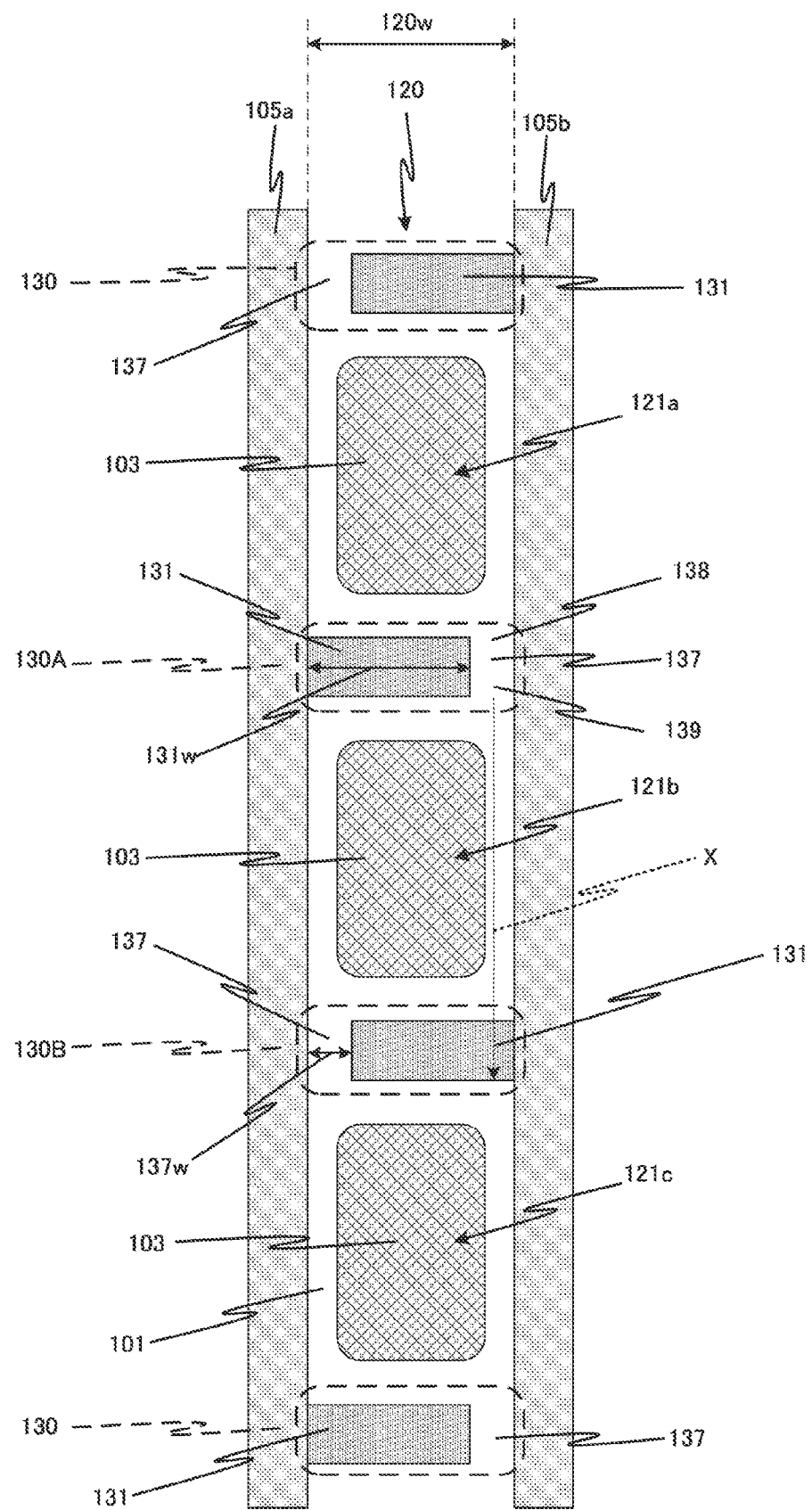
FIG. 6 is a partially enlarged top view illustrating the organic EL light-emitting device according to Embodiment 1.

FIG. 6 is an enlarged view illustrating rectangle a of organic EL light-emitting device 100 as shown in FIG. 5. The same constituent elements as those in FIG. 5 are denoted by the same reference signs, and description thereof will not be repeated here. In FIG. 6, color emission region 120 is defined by two main banks (105a and 105b) opposing each other. FIG. 6 shows three pixel regions 121 (first pixel region 121a, second pixel region 121b, and third pixel region 121c) consecutively arranged in one row.

As shown in FIG. 6, pixel isolation region 130 is arranged between pixel regions 121. Pixel isolation region 130A is provided between first pixel region 121a and second pixel region 121b. Pixel isolation region 130B is provided between second pixel region 121b and third pixel region 121c.

Each pixel isolation region 130 has groove 137 and one auxiliary bank 131. Auxiliary bank 131 arranged in pixel isolation region 130A is connected only to main bank 105a. On the other hand, auxiliary bank 131 arranged in pixel isolation region 130B is connected only to main bank 105b. The length 131w of auxiliary bank 131 in each pixel isolation region 130 in a direction perpendicular to the line direction (hereinafter also referred to as "length of auxiliary bank") is equal to or larger than ½ of the length of the light emission region 120w in the minor axis direction.

Width 137w of groove 137 is preferably small. More specifically, width 137w of the groove is preferably 5 to 20 μm. Groove 137 in pixel isolation region 130A includes end portion 138 at first pixel region 121a and end portion 139 at second pixel region 121b. The projection of end portion 139 of groove 137 in pixel isolation region 130A is arranged to overlap auxiliary bank 131 in pixel isolation region 130B.

As described above, the projection of end portion 139 of groove 137 in pixel isolation region 130A is arranged to overlap auxiliary bank 131 in pixel isolation region 130B. Accordingly, during manufacturing of the organic EL light-emitting device, even when a foreign substance such as particles is attached to the color emission region, the material liquid of the organic function layer can be prevented from being absorbed by the foreign substance (see FIG. 4).

When width 137w of the groove is small as in the present embodiment, a region of the common counter electrode corresponding to main bank 105a and a region he common counter electrode corresponding to main bank 105b are easily connected to each other via a region of the common counter electrode corresponding to on auxiliary bank 131. Therefore, when width 137w of the groove is small as in the present embodiment, the common counter electrode is less likely to be segmented. Therefore, according to the present embodiment, the thickness of the common counter electrode can be reduced.

Embodiment 2

In the description as regards Embodiment 2, the auxiliary bank is not connected to the main bank.

Figure 7:
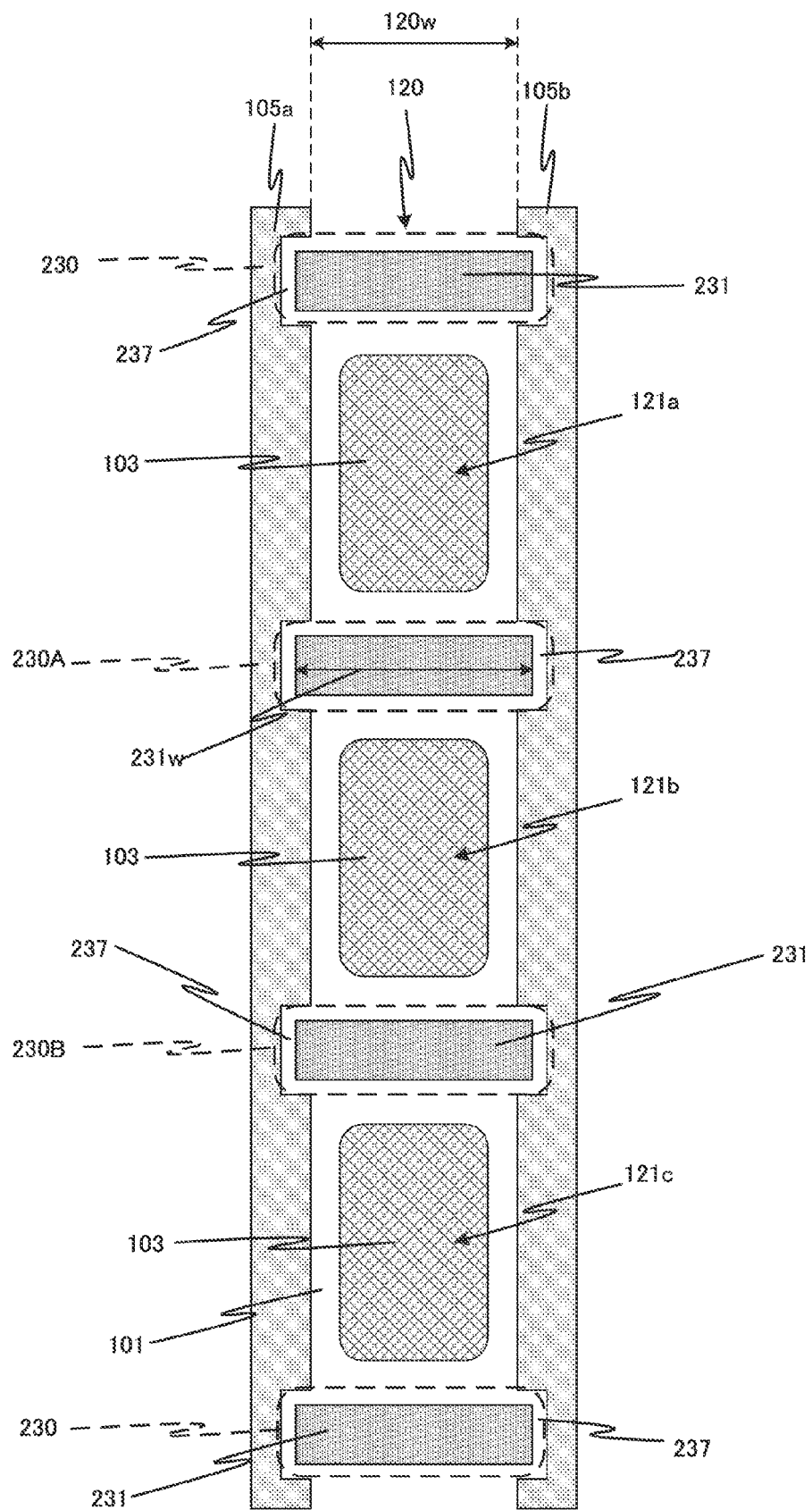
FIG. 7 is a partially enlarged top view illustrating an organic EL light-emitting device according to Embodiment 2.

FIG. 7 is a partially enlarged top view illustrating an organic EL light-emitting device according to Embodiment 2.

As shown in FIG. 7, the organic EL light-emitting device according to Embodiment 2 is the same as the organic EL light-emitting device according to Embodiment 1, except that the organic EL light-emitting device according to Embodiment 2 has pixel isolation region 230. The same constituent elements as those of the organic EL light-emitting device according to Embodiment 1 are denoted by the same reference signs, and description thereof will not be repeated here.

As shown in FIG. 7, each pixel isolation region 230 has two grooves 237 and one auxiliary bank 231. The main bank has a recessed portion. The recessed portion of main bank 105a is opposite the recessed portion of main bank 105b.

The auxiliary bank 231 is provided between the recessed portion of main bank 105a and the recessed portion of main bank 105b which are opposite each other. Auxiliary bank 231 is not connected to main bank 105. Groove 237 is constituted by a gap formed between auxiliary bank 231 and the recessed portion formed in main bank 105. Length 231w of auxiliary bank 231 is preferably equal to or larger than length 120w of the color emission region in the minor axis direction.

Embodiment 3

In the descriptions as regards Embodiments 1 and 2, each pixel isolation region is provided with one auxiliary bank. In the descriptions as regards Embodiments 3 to 5, each pixel isolation region is provided with two auxiliary banks.

Figure 8:
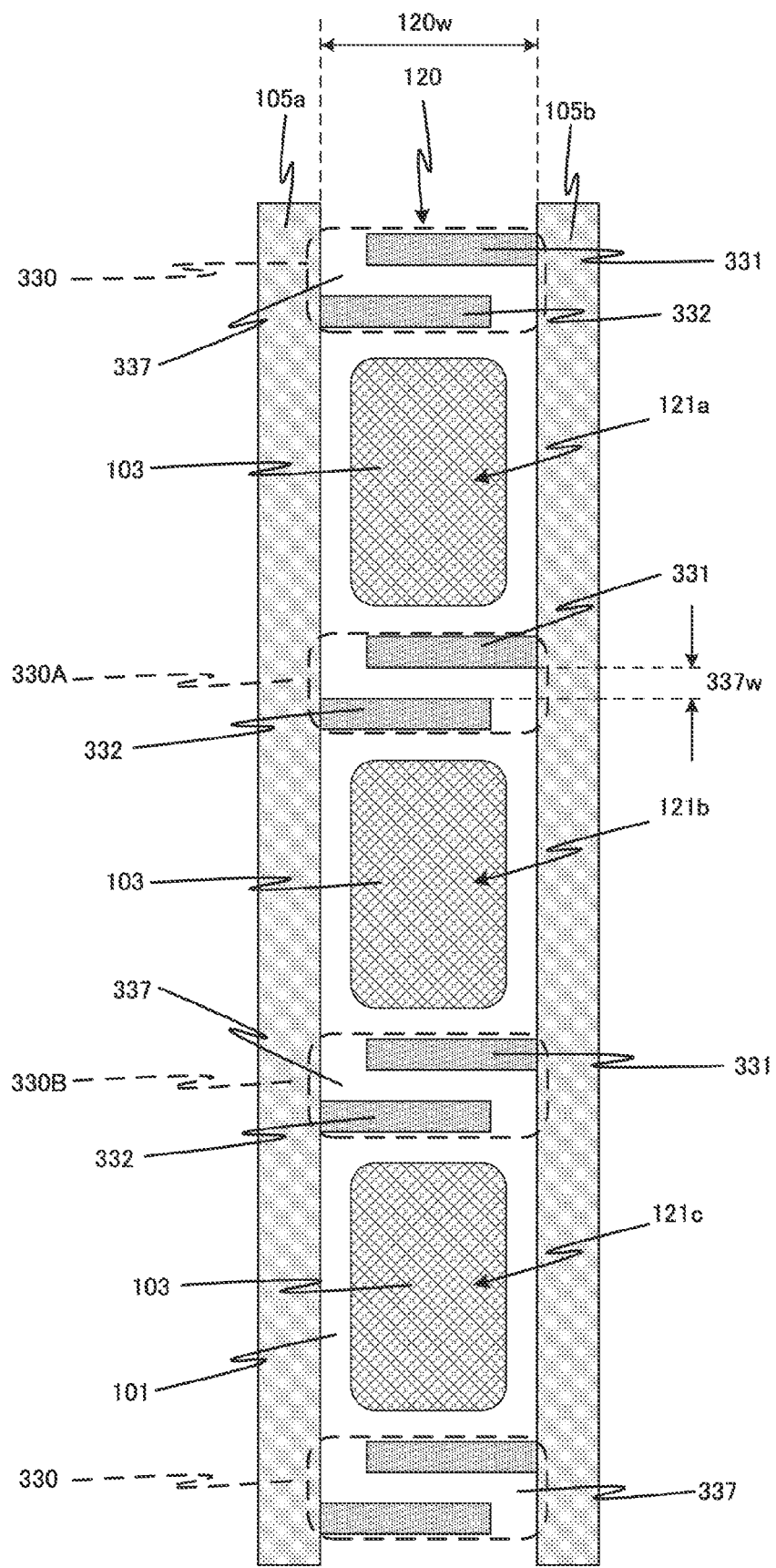
FIG. 8 is a partially enlarged top view illustrating an organic EL light-emitting device according to Embodiment 3.

FIG. 8 is a partially enlarged top view illustrating an organic EL light-emitting device according to Embodiment 3. As shown in FIG. 8, the organic EL light-emitting device according to Embodiment 3 is the same as the organic EL light-emitting device according to Embodiment 1, except that the organic EL light-emitting device according to Embodiment 3 has pixel isolation region 330. The same constituent elements as those of the organic EL light-emitting device according to Embodiment 1 are denoted by the same reference signs, and description thereof will not be repeated here.

As shown in FIG. 8, each pixel isolation region 330 is provided with serpentine groove 337, first auxiliary bank 331, and second auxiliary bank 332.

First auxiliary bank 331 is connected only to main bank 105b. Second auxiliary bank 332 is connected only to main bank 105a. The position of first auxiliary bank 331 in the line direction is different from the position of second auxiliary bank 332 in the line direction. The length of first auxiliary bank 331 and second auxiliary bank 332 is equal to or larger than ½ of length 120w of the color emission region in the minor axis direction. Clearance 337w between first auxiliary bank 331 and second auxiliary bank 332 is preferably 5 to 20 μm.

As described above, in the present embodiment, each pixel isolation region is provided with two auxiliary banks. Therefore, according to the present embodiment, the fluidity of the material liquid applied to the color emission region can be reduced more greatly than Embodiments 1 and 2.

Embodiment 4

In the descriptions as regards Embodiment 4, the first auxiliary bank and the second auxiliary bank have a protrusion.

Figure 9:
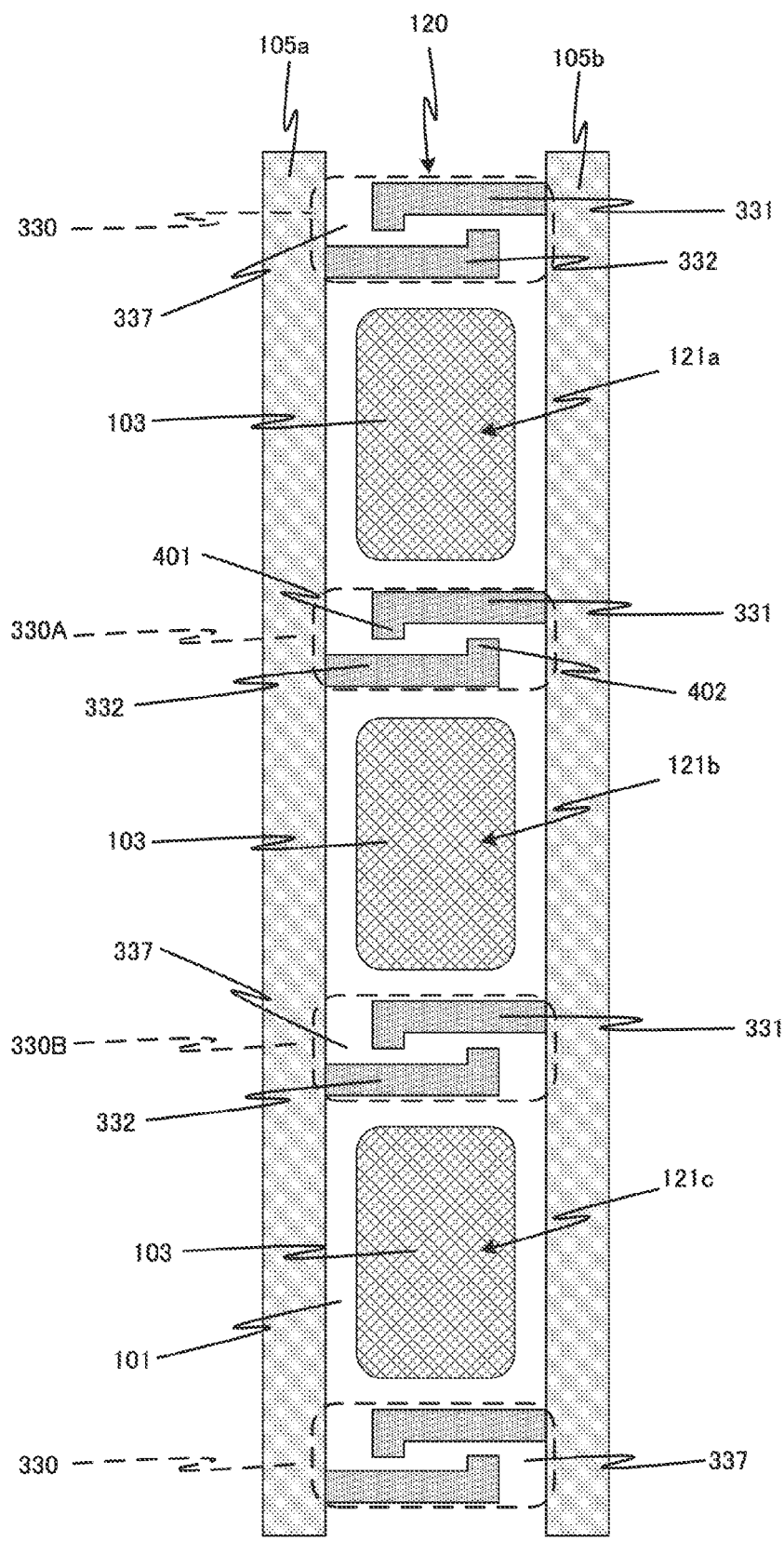
FIG. 9 is a partially enlarged top view illustrating an organic EL light-emitting device according to Embodiment 4.

FIG. 9 is a partially enlarged top view illustrating an organic EL light-emitting device according to Embodiment 4. As shown in FIG. 9, the organic EL light-emitting device according to Embodiment 4 is the same as the organic EL light-emitting device according to Embodiment 3, except that the auxiliary bank in the Embodiment 4 has a protrusion. The same constituent elements as those of the organic EL light-emitting device according to Embodiment 3 are denoted by the same reference signs, and description thereof will not be repeated here.

As shown in FIG. 9, in each pixel isolation region 330, first auxiliary bank 331 has protrusion 401, and second auxiliary bank 332 has protrusion 402. More specifically, protrusion 401 is arranged at an end portion of first auxiliary bank 331, and is arranged to face second auxiliary bank 332. On the other hand, protrusion 402 is arranged at an end portion of second auxiliary bank 332, and is arranged to face first second auxiliary bank 331.

As described above, first auxiliary bank 331 has protrusion 401, and second auxiliary bank has protrusion 402. Accordingly, the material liquid is less likely to flow through groove 337. Therefore, the fluidity of the material liquid applied to the color emission region can be further suppressed.

Embodiment 5

In the descriptions as regards Embodiment 5, a main bank has a recessed portion connected to a groove in a pixel isolation region.

Figure 10:
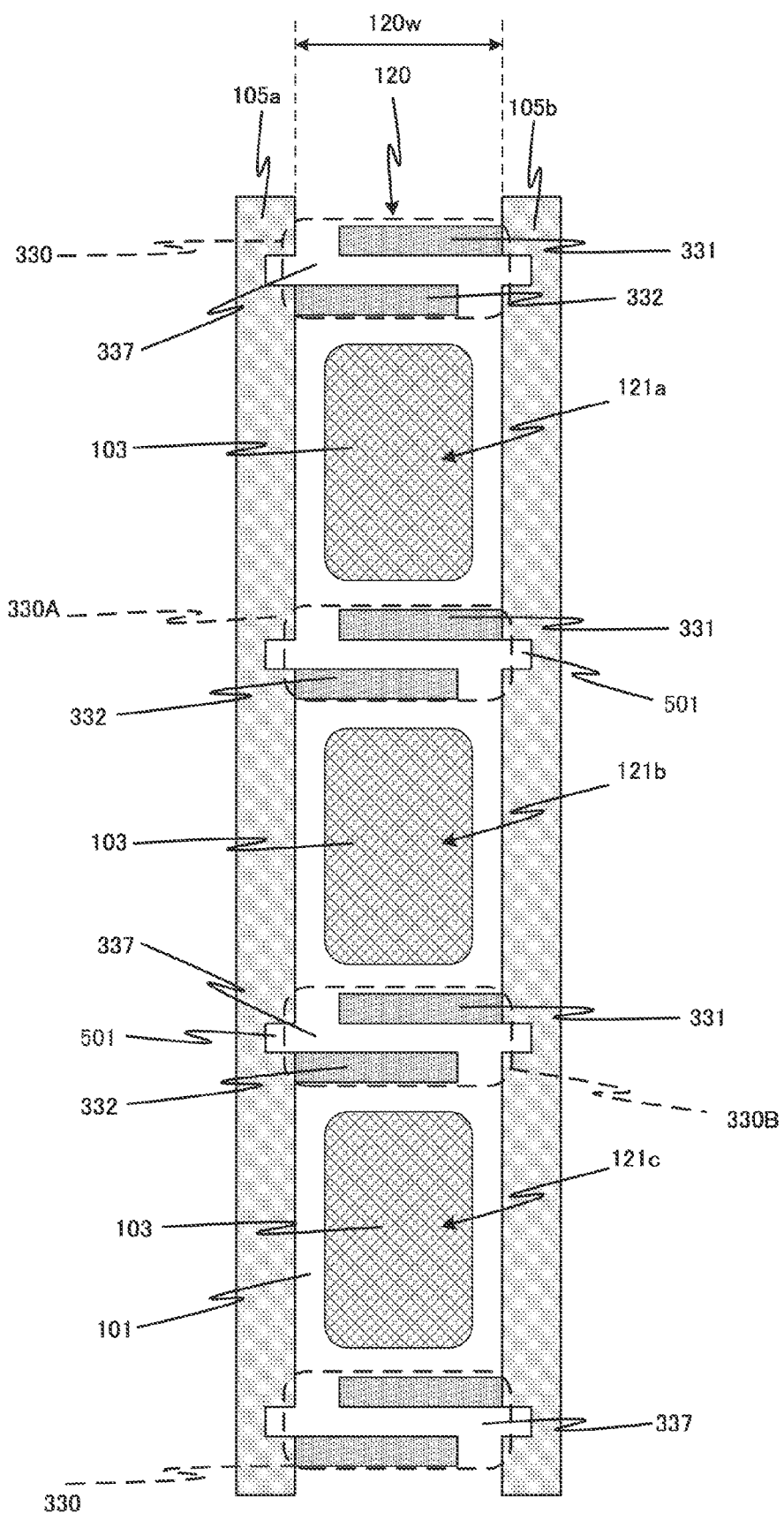
FIG. 10 is a partially enlarged top view illustrating an organic EL light-emitting device according to Embodiment 5.

FIG. 10 is a partially enlarged top view illustrating an organic EL light-emitting device according to Embodiment 5. As shown in FIG. 10, the organic EL light-emitting device according to Embodiment 5 is the same as the organic EL light-emitting device according to Embodiment 3, except that the main bank in the Embodiment 5 has a recessed portion. The same constituent elements as those of the organic EL light-emitting device according to Embodiment 3 are denoted by the same reference signs, and description thereof will not be repeated here.

As shown in FIG. 10, main bank 105 has recessed portions 501 connected to each groove 337. As described above, main bank 105 has recessed portions 501 connected to groove 337, and accordingly, the material liquid is less likely to flow through groove 337. Therefore, the fluidity of the material liquid applied to the color emission region can be further suppressed.

Embodiment 6

In the descriptions as regards Embodiments 3 to 5, each pixel isolation region is provided with two auxiliary banks. In the descriptions as regards Embodiments 6 and 7, each pixel isolation region is provided with three auxiliary banks.

Figure 11:
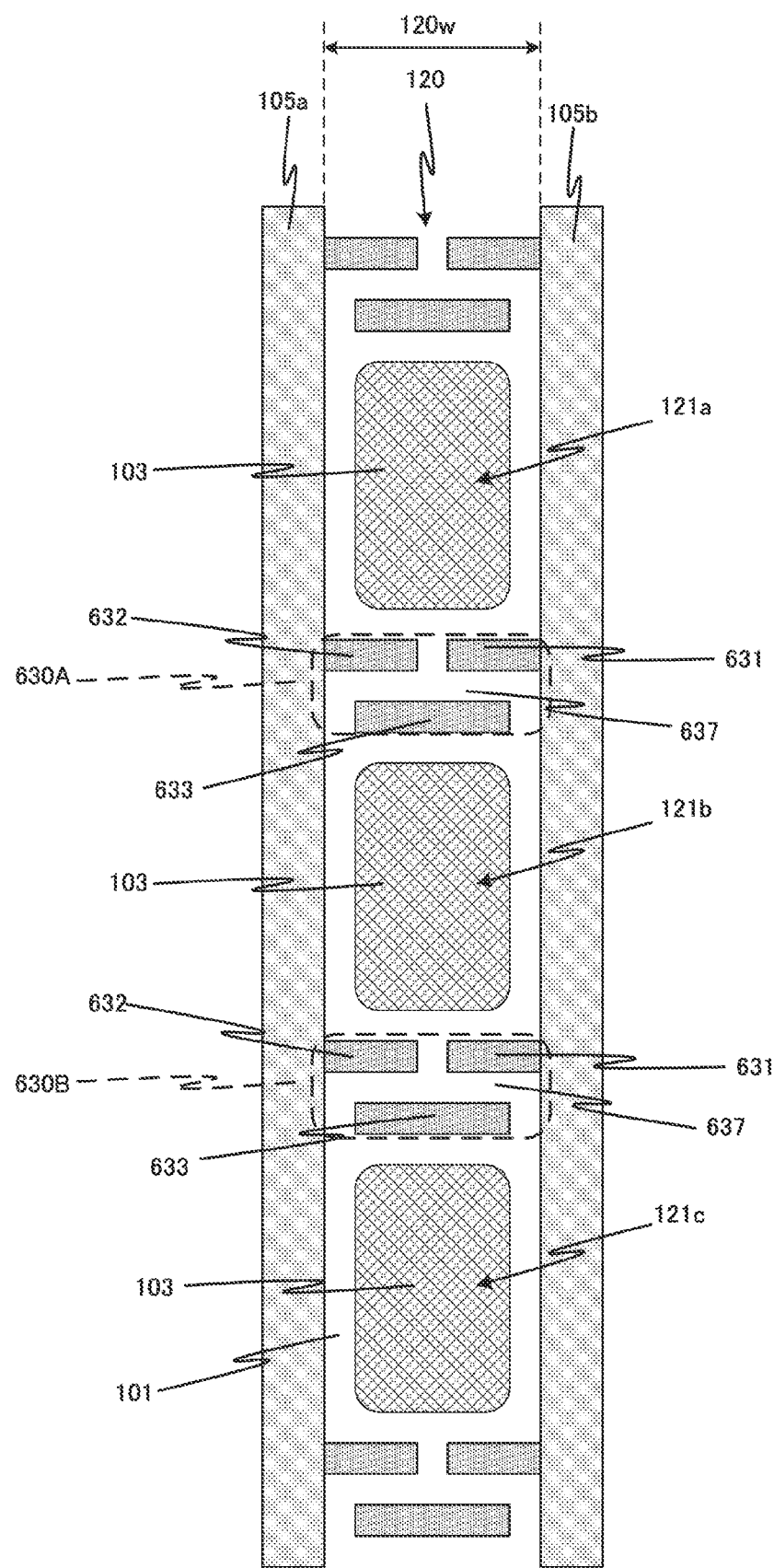
FIG. 11 is a partially enlarged top view illustrating an organic EL light-emitting device according to Embodiment 6.

FIG. 11 is a partially enlarged top view illustrating an organic EL light-emitting device according to Embodiment 6. As shown in FIG. 11, the organic EL light-emitting device according to Embodiment 6 is the same as the organic EL light-emitting device according to Embodiment 1, except that the organic EL light-emitting device according to Embodiment 6 has pixel isolation region 630. The same constituent elements as those of the organic EL light-emitting device according to Embodiment 1 are denoted by the same reference signs, and description thereof will not be repeated here.

As shown in FIG. 11, each pixel isolation region 630 is provided with groove 637, first auxiliary bank 631, second auxiliary bank 632, and third auxiliary bank 633.

First auxiliary bank 631 is connected only to main bank 105b. Second auxiliary bank 632 is connected only to main bank 105a. First auxiliary bank 631 and second auxiliary bank 632 are opposing each other. Groove 637 is arranged between first auxiliary bank 631 and second auxiliary bank 632.

Figure 14:
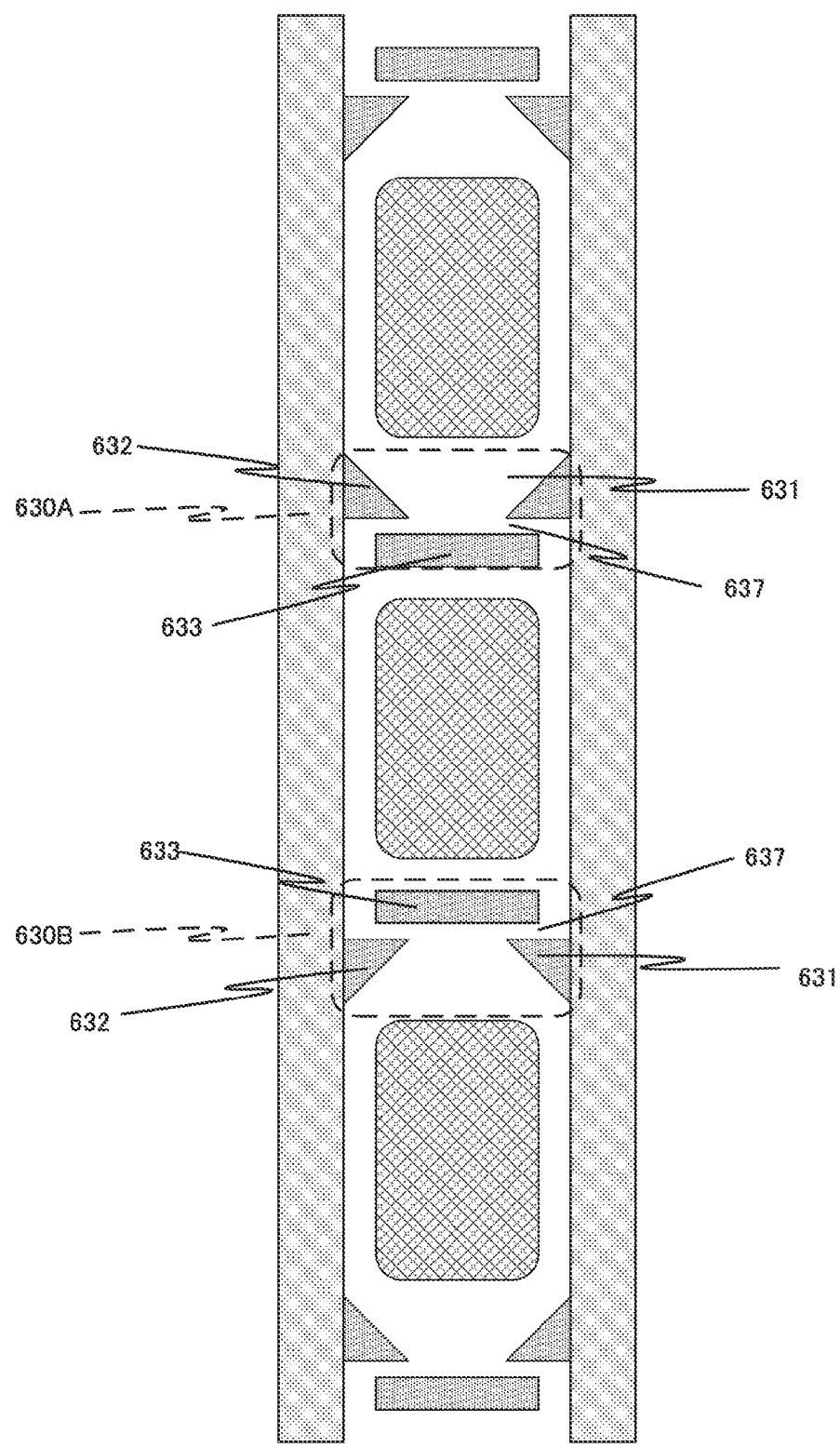
FIG. 14 is a partially enlarged top view illustrating the organic EL light-emitting device according to Embodiment 6.

Alternatively, first auxiliary bank 631 and second auxiliary bank 632 may be in a triangular prism shape (see FIG. 14).

Figure 15:
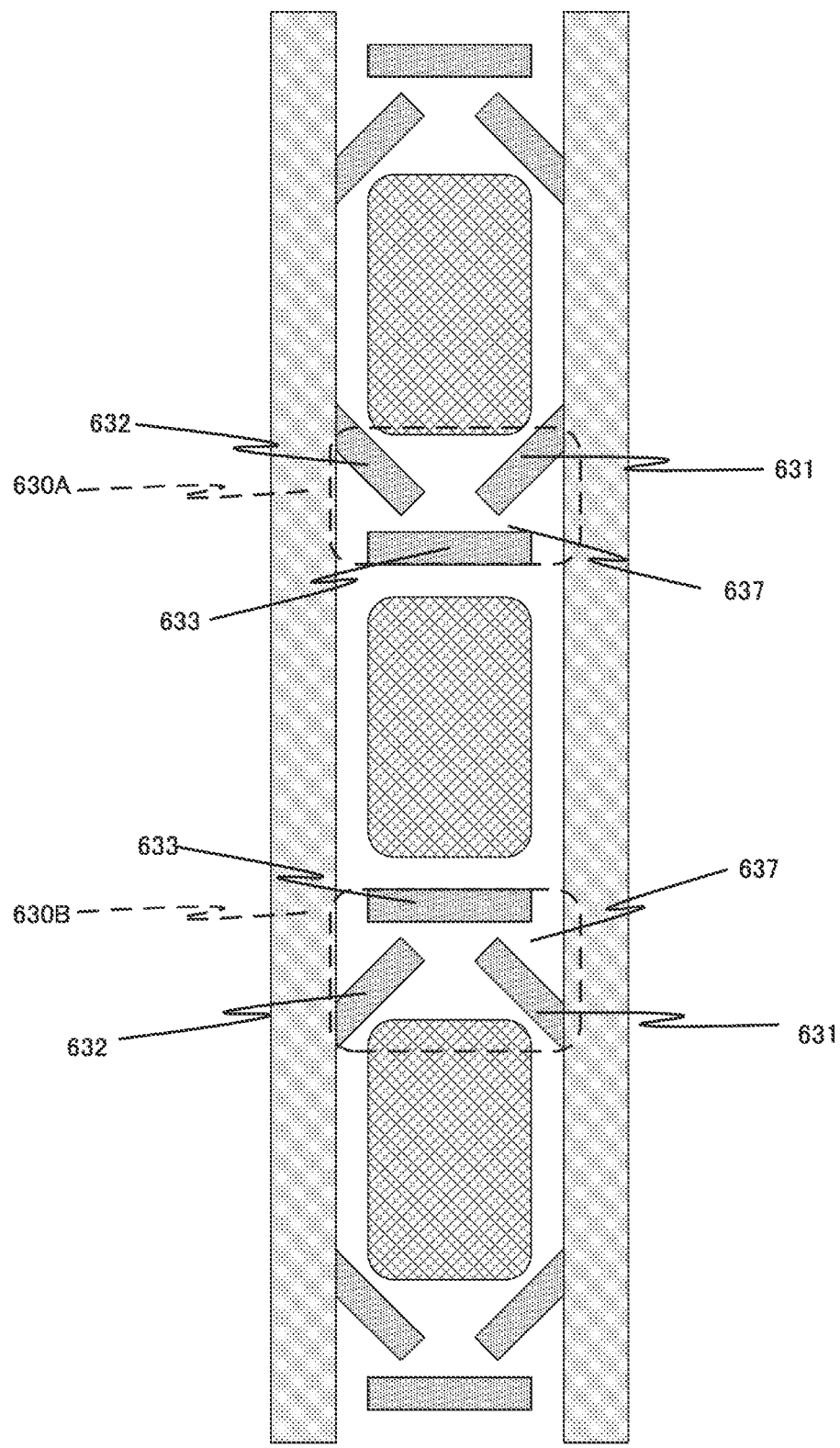
FIG. 15 is a partially enlarged top view illustrating the organic EL light-emitting device according to Embodiment 6.

Still alternatively, the major axes of first auxiliary bank 631 and second auxiliary bank 632 may be inclined with respect to the main bank (see FIG. 15).

On the other hand, the position of third auxiliary bank 633 in the line direction is different from the position of first auxiliary bank 631 and second auxiliary bank 632 in the line direction. The position of third auxiliary bank 633 in a direction perpendicular to the line direction overlaps the position of groove 637 arranged between first auxiliary bank 631 and second auxiliary bank 632. Further, third auxiliary bank 633 is preferably not connected to main banks 105. Alternatively, the wall of third auxiliary bank 633 may be a curved surface (see FIGS. 13A and 13B).

Figure 13B:
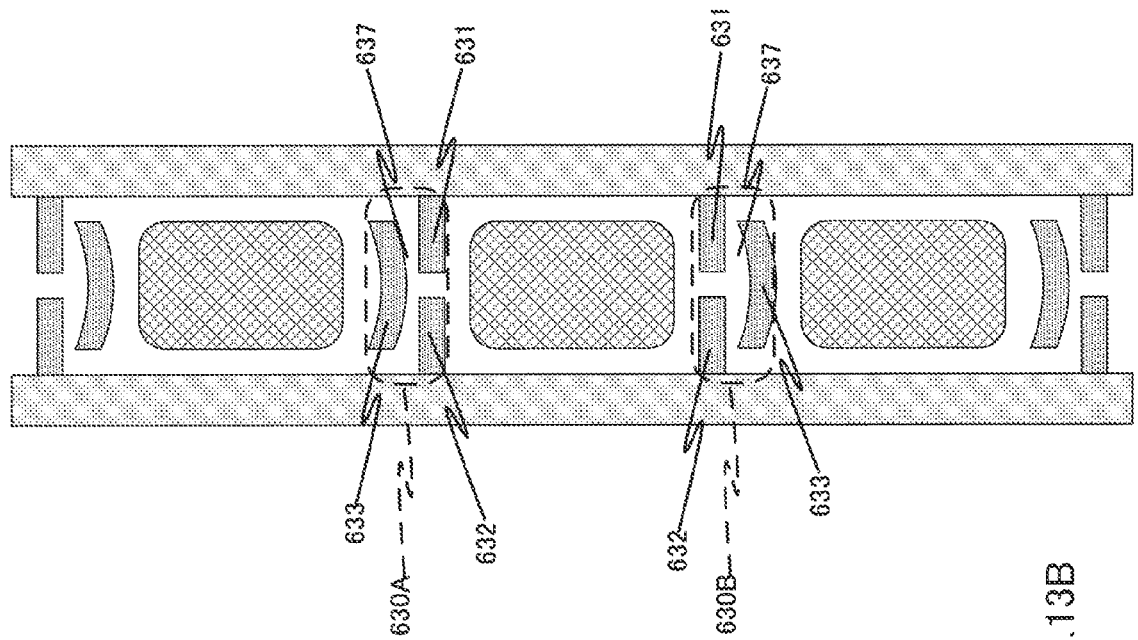
FIG. 13 is a partially enlarged top view illustrating the organic EL light-emitting device according to Embodiment 6.
Figure 13A:
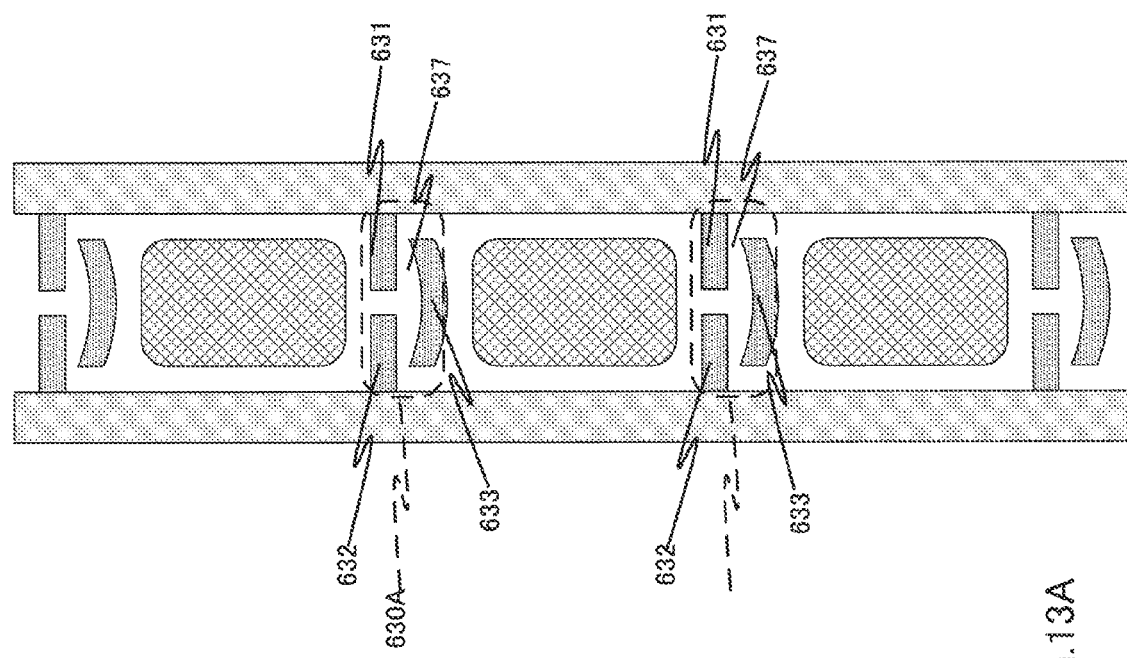

As shown in FIG. 11, the arrangement of first auxiliary bank 631, second auxiliary bank 632, and third auxiliary bank 633 in pixel isolation region 630A may be the same as the arrangement of first auxiliary bank 631, second auxiliary bank 632, third auxiliary bank 633 in pixel isolation region 630B (see FIGS. 11 and 13A). In this case, second pixel region 121b is sandwiched between third auxiliary bank 633 in pixel isolation region 630A and first auxiliary bank 631 and second auxiliary bank 632 in pixel isolation region 630B.

Figure 12:
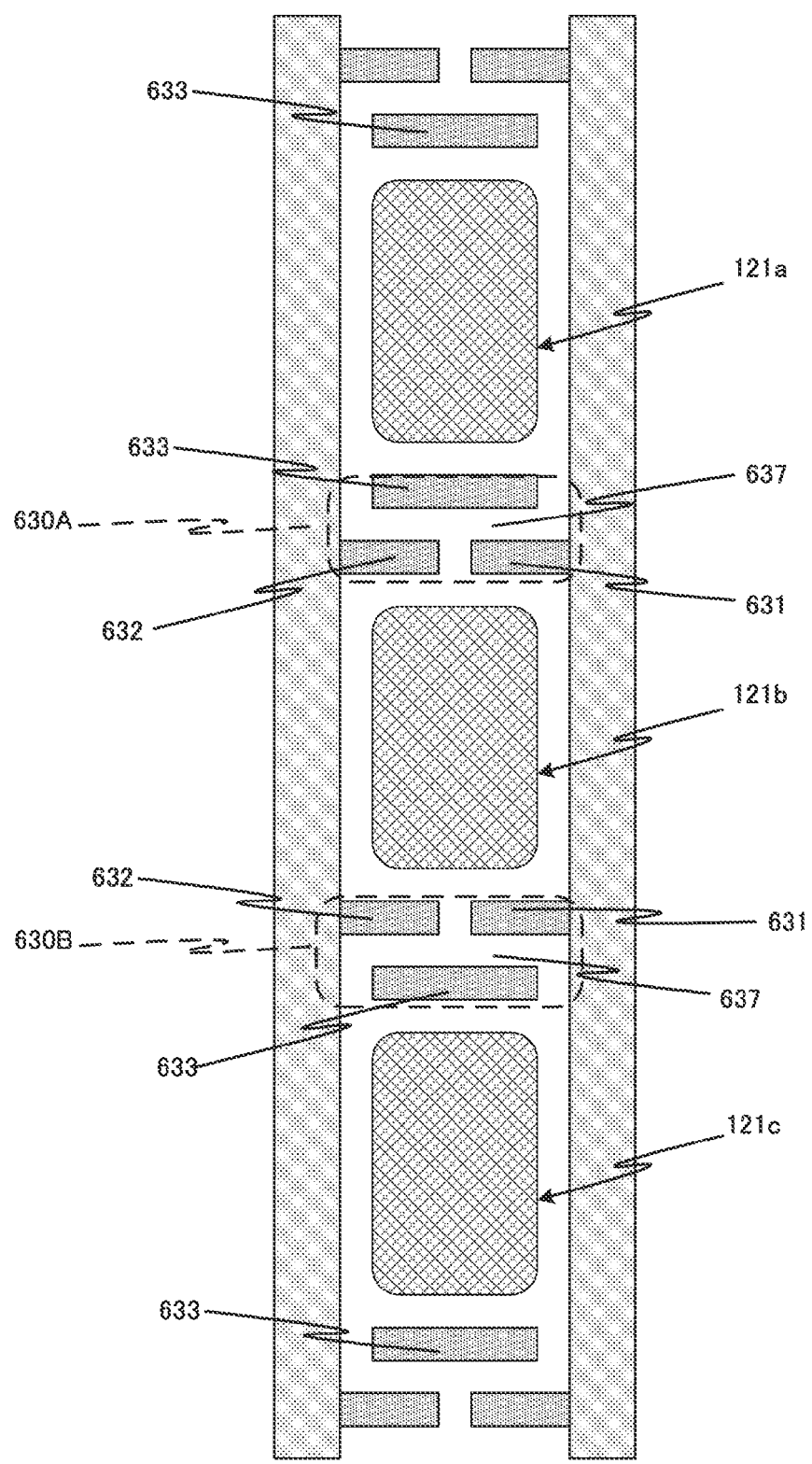
FIG. 12 is a partially enlarged top view illustrating the organic EL light-emitting device according to Embodiment 6.

On the other hand, the arrangement of first auxiliary bank 631, second auxiliary bank 632, and third auxiliary bank 633 in pixel isolation region 630A may be axisymmetrical to the arrangement of first auxiliary bank 631, second auxiliary bank 632, third auxiliary bank 633 in pixel isolation region 630B with respect to a line perpendicular to the line direction (see FIGS. 12 and 13B). In this case, second pixel region 121b is sandwiched between first and auxiliary banks 631/632 in pixel isolation region 630A and first and second auxiliary banks 631/632 in pixel isolation region 630B.

As described above, in the present embodiment, each pixel isolation region is provided with three auxiliary banks. Therefore, the fluidity of the material liquid applied to the color emission region can be further suppressed.

Embodiment 7

In the descriptions as regards Embodiment 6, the position of the third auxiliary bank in the line direction is different from the position of the first auxiliary bank and the second auxiliary bank in the line direction. In the descriptions as regards Embodiment 7, the position of the third auxiliary bank in the line direction is the same as the position of the first auxiliary bank and the second auxiliary bank in the line direction.

Figure 16:
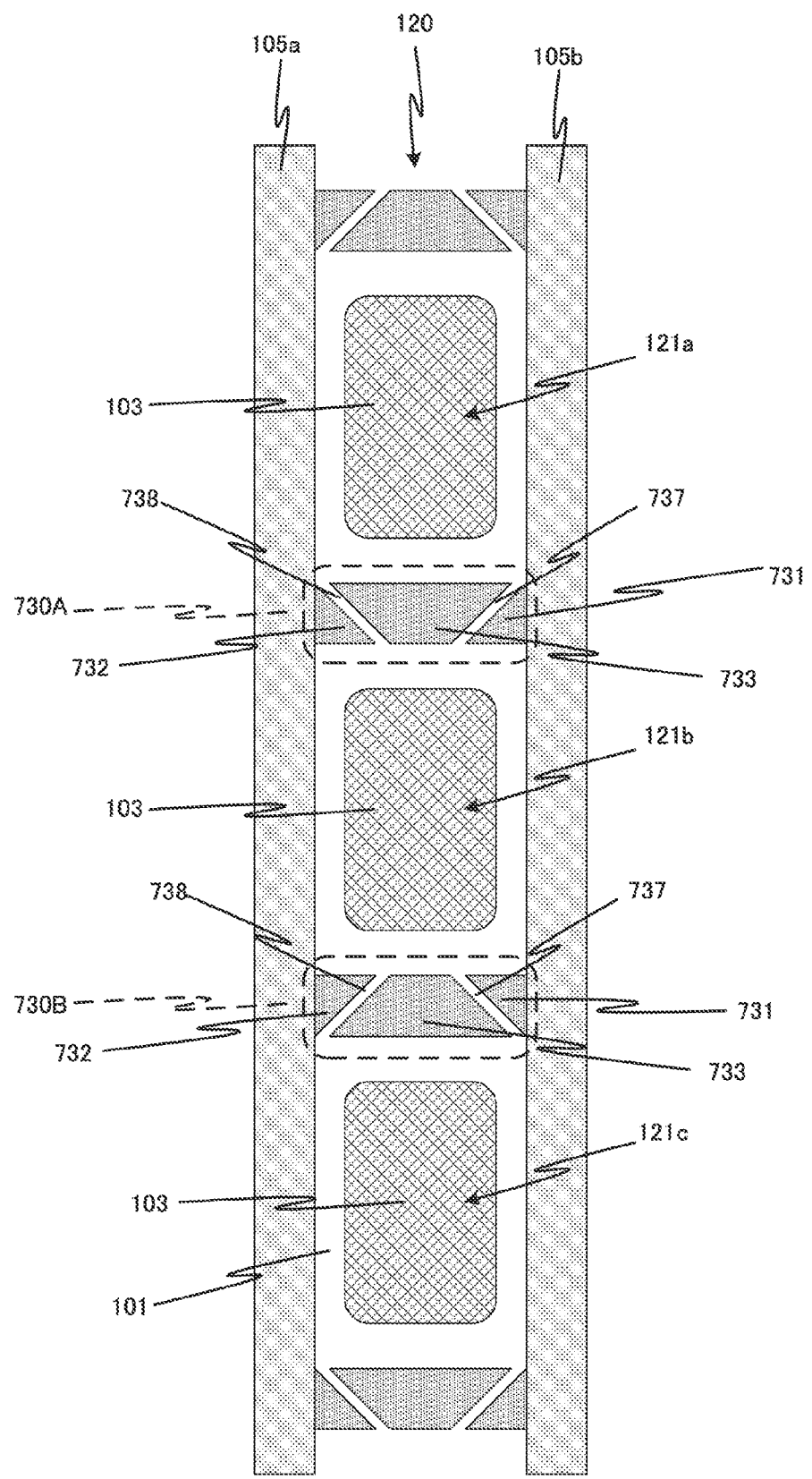
FIG. 16 is a partially enlarged top view illustrating an organic EL light-emitting device according to Embodiment 7.

FIG. 16 is a partially enlarged top view illustrating an organic EL light-emitting device according to Embodiment 7. As shown in FIG. 16, the organic EL light-emitting device according to Embodiment 7 is the same as the organic EL light-emitting device according to Embodiment 1, except that the organic EL light-emitting device according to Embodiment 7 has pixel isolation region 730. The same constituent elements as those of the organic EL light-emitting device according to Embodiment 1 are denoted by the same reference signs, and description thereof will not be repeated here.

As shown in FIG. 16, each pixel isolation region 730 is provided with two grooves (737 and 738), first auxiliary bank 731, second auxiliary bank 732 and third auxiliary bank 733.

First auxiliary bank 731 is connected only to main bank 105b. Second auxiliary bank 732 is connected only to main bank 105a. First auxiliary bank 731 and second auxiliary bank 732 are opposing each other. Third auxiliary bank 733 is arranged between first auxiliary bank 731 and second auxiliary bank 732. In this configuration, groove 737 is formed between first auxiliary bank 731 and third auxiliary bank 733, and groove 738 is formed between second auxiliary bank 732 and third auxiliary bank 733.

Figure 17:
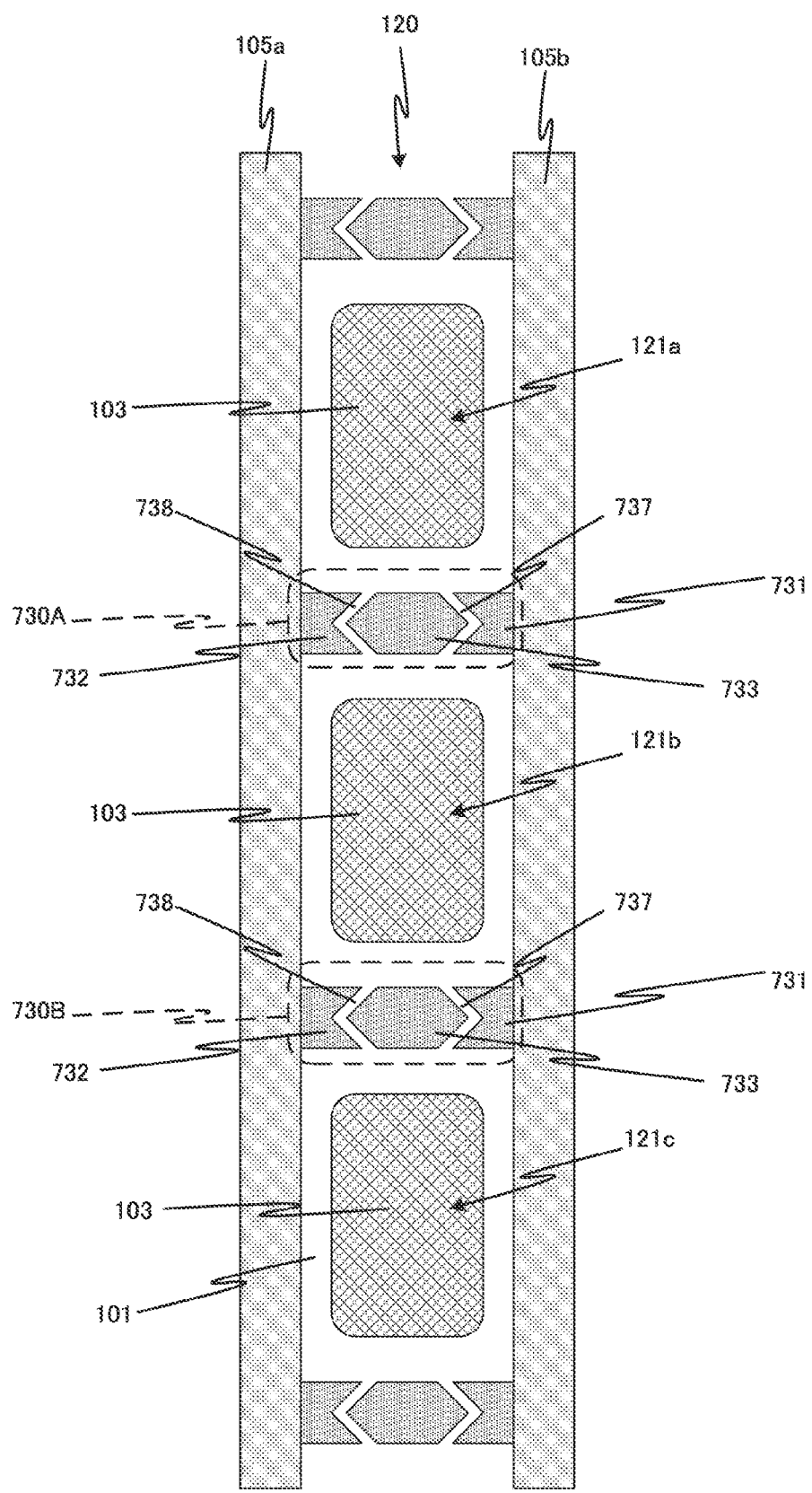
FIG. 17 is a partially enlarged top view illustrating the organic EL light-emitting device according to Embodiment 7.

Grooves (737 and 738) are preferably inclined with respect to the line direction. As shown in FIG. 17, the grooves (737 and 738) may be bent.

As described above, in the present embodiment, the third auxiliary bank is arranged between the first auxiliary bank and the second auxiliary bank, which are opposing each other. Therefore, while the fluidity of the material liquid is suppressed, the length of the pixel isolation region in the line direction can be reduced. Accordingly, the distance between the pixel regions can be reduced, and this can improve the aperture ratio of the organic EL light-emitting device.

Embodiment 8

In the descriptions as regards Embodiments 6 and 7, each pixel isolation region is provided with three auxiliary banks. In the descriptions as regards Embodiment 8, each pixel isolation region is provided with four auxiliary banks.

Figure 18:
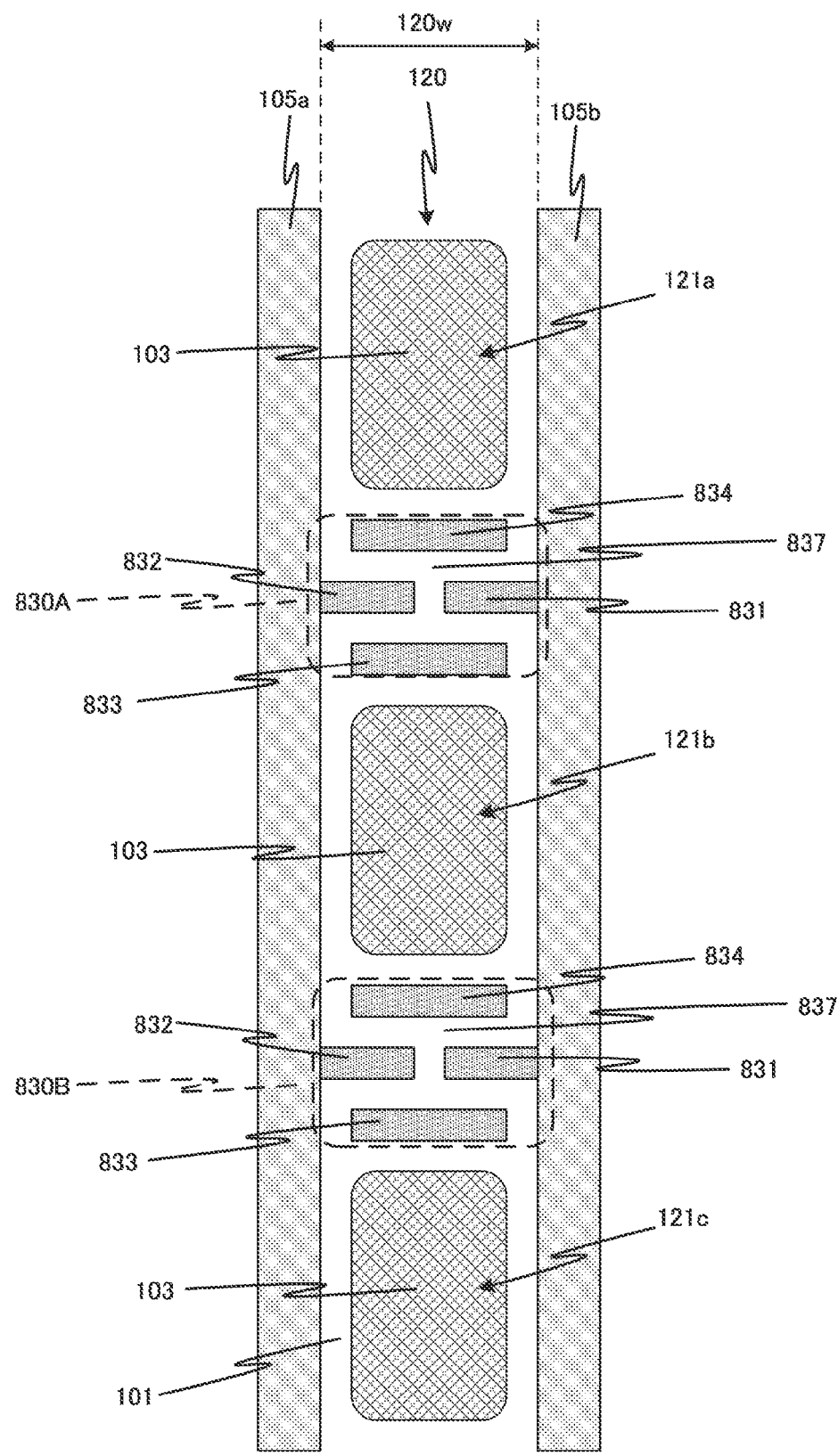
FIG. 18 is a partially enlarged top view illustrating an organic EL light-emitting device according to Embodiment 8.

FIG. 18 is a partially enlarged top view illustrating an organic EL light-emitting device according to Embodiment 8. As shown in FIG. 18, the organic EL light-emitting device according to Embodiment 8 is the same as the organic EL light-emitting device according to Embodiment 1, except that the organic EL light-emitting device according to Embodiment 8 has pixel isolation region 830. The same constituent elements as those of the organic EL light-emitting device according to Embodiment 1 are denoted by the same reference signs, and description thereof will not be repeated here.

As shown in FIG. 18, each pixel isolation region 830 is provided with groove 837, first auxiliary bank 831, second auxiliary bank 832, third auxiliary bank 833, and fourth bank 834.

First auxiliary bank 831 is connected only to main bank 105b. Second auxiliary bank 832 is connected only to main bank 105a. First auxiliary bank 831 and second auxiliary bank 832 are arranged to face each other. Groove 837 is arranged between first auxiliary bank 831 and second auxiliary bank 832.

In the present embodiment, first auxiliary bank 831 and second auxiliary bank 832 are sandwiched between third auxiliary bank 833 and fourth auxiliary bank 834. The position of third auxiliary bank 833 in a direction perpendicular to the line direction and the position of fourth auxiliary bank 834 in a direction perpendicular to the line direction are arranged to overlap the position of the groove arranged between first auxiliary bank 831 and second auxiliary bank 832. Further, third auxiliary bank 833 and fourth auxiliary bank 834 are preferably not connected to main bank 105.

Figure 19:
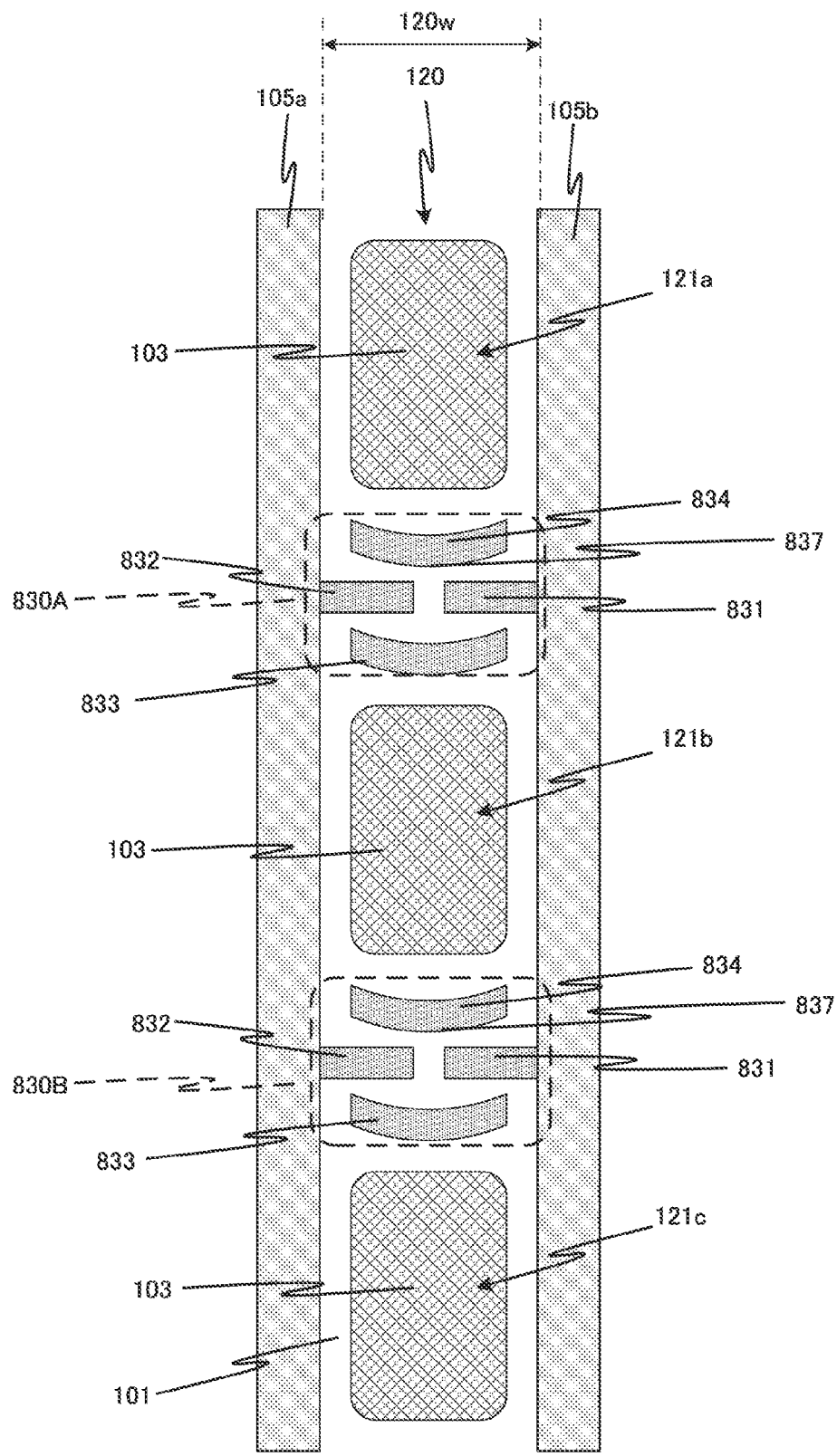
FIG. 19 is a partially enlarged top view illustrating the organic EL light-emitting device according to Embodiment 8.

The wall surfaces of third auxiliary bank 833 and fourth auxiliary bank 834 may be curved surfaces (see FIG. 19).

As described above, in the present embodiment, each pixel isolation region is provided with four auxiliary banks. Therefore, the fluidity of the material liquid applied to the color emission region can be further suppressed.

Embodiment 9

In the descriptions as regards Embodiment 8, each pixel isolation region is provided with four auxiliary banks. In the descriptions as regards Embodiment 9, each pixel isolation region is provided with five auxiliary banks.

Figure 20:
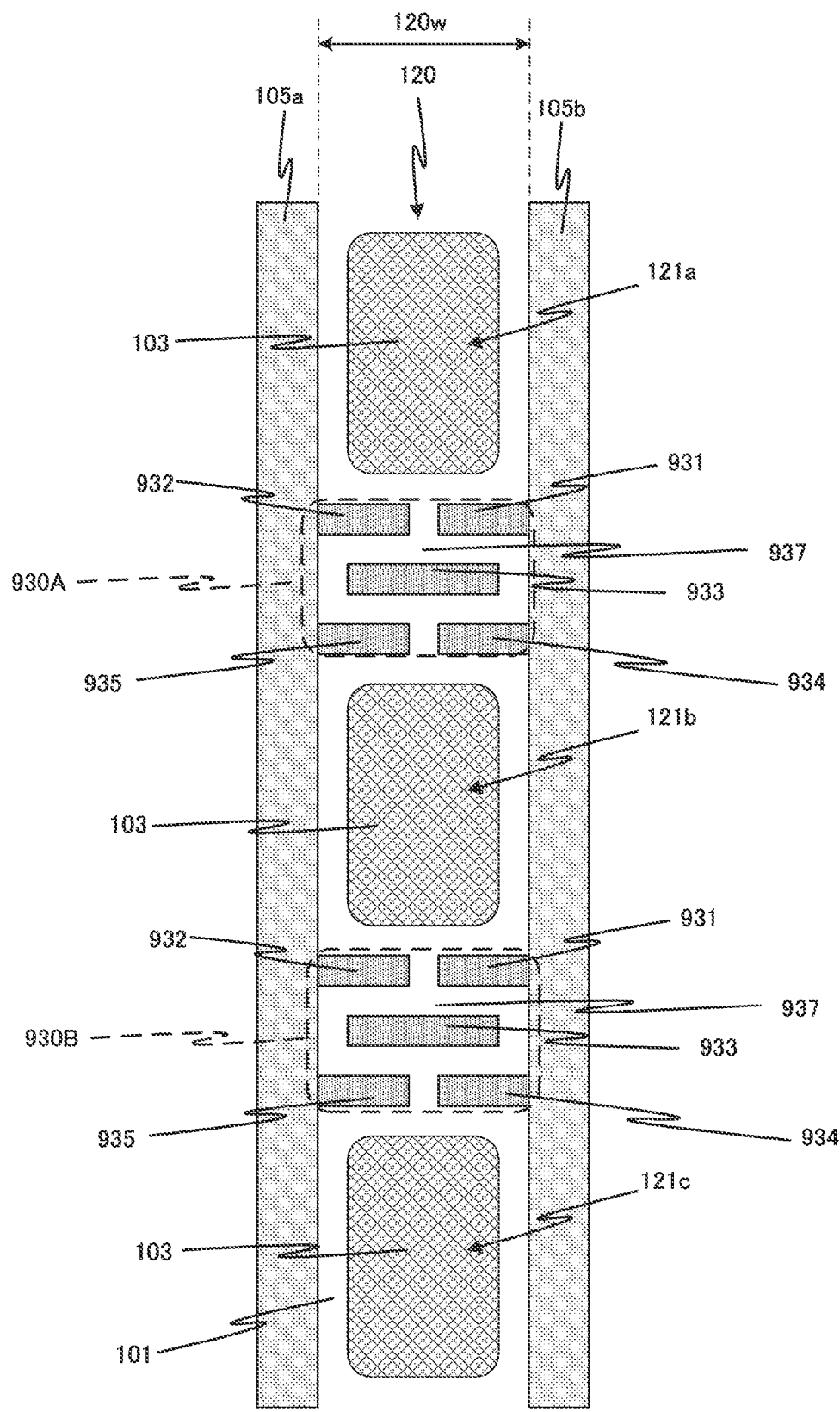
FIG. 20 is a partially enlarged top view illustrating an organic EL light-emitting device according to Embodiment 9.

FIG. 20 is a partially enlarged top view illustrating an organic EL light-emitting device according to Embodiment 9. As shown in FIG. 20, the organic EL light-emitting device according to Embodiment 9 is the same as the organic EL light-emitting device according to Embodiment 1, except that the organic EL light-emitting device according to Embodiment 9 has pixel isolation region 930. The same constituent elements as those of the organic EL light-emitting device according to Embodiment 1 are denoted by the same reference signs, and description thereof will not be repeated here.

As shown in FIG. 20, each pixel isolation region 930 is provided with groove 937, first auxiliary bank 931, second auxiliary bank 932, third auxiliary bank 933, fourth bank 934, and fifth auxiliary bank 935.

First auxiliary bank 931 and fourth auxiliary bank 934 are connected only to main bank 105b. Second auxiliary bank 932 and fifth auxiliary bank 935 are connected only to main bank 105a. First auxiliary bank 931 and second auxiliary bank 932 are opposing each other, and fourth auxiliary bank 934 and fifth auxiliary bank 935 are arranged opposing each other. Therefore, the position of first auxiliary bank 931 and second auxiliary bank 932 in the line direction is different from the position of fourth auxiliary bank 934 and fifth auxiliary bank 935 in the line direction.

In the present embodiment, third auxiliary bank 933 is sandwiched between first and second auxiliary banks 931/932 and fourth and fifth auxiliary banks 934/935. On the other hand, the position of third auxiliary bank 933 in a direction perpendicular to the line direction is different from the position of the groove arranged between first auxiliary bank 931 and second auxiliary bank 932 and the position of the groove arranged between fourth auxiliary bank 934 and fifth auxiliary bank 935. Third auxiliary bank 933 is preferably not connected to main bank 105.

As described above, in the present embodiment, each pixel isolation region is provided with five auxiliary banks. Therefore, the fluidity of the material liquid applied to the color emission region can be further suppressed.

The present application is entitled and claims the priority of Japanese Patent Application No. 2008-322135 filed on Dec. 18, 2008, the entire content of which is incorporated by reference.

INDUSTRIAL APPLICABILITY

The organic EL light-emitting device according to the present invention can be used as an organic EL display for a monitor of an information device terminal such as a large screen television set and a cellular phone.

REFERENCE SIGNS LIST

100: organic EL light-emitting device
101: substrate
103: pixel electrode
105: main bank
107: material liquid of organic function layer
120: color emission region
121: pixel region
130, 230, 330, 630, 730, 830, and 930: pixel isolation regions
131, 231, 331, 332, 631, 632, 633, 731, 732, 733, 831, 832, 833, 834, 931, 932, 933, 934, and 935: auxiliary banks
137, 237, 337, 637, 737, 738, 837, and 937: grooves
138 and 139: end portions of grooves
150: foreign substance
401 and 402: protrusions
501: recessed portion

The invention claimed is:

1. An organic EL light-emitting device comprising:
   a substrate having a color emission region, the color emission region having two or more pixel regions arranged in one row;
   linear main banks for defining the color emission region, the main banks opposing each other;
   a pixel isolation region arranged between each of the pixel regions in the color emission region;
   a pixel electrode arranged for each of the pixel regions; and
   an organic function layer arranged over the pixel electrode,
   wherein the pixel isolation region includes an auxiliary bank and a groove, the groove for making the pixel regions in communication with each other, and
   wherein, when the pixel regions includes a first pixel region, a second pixel region, and a third pixel region, the first, second and third pixel regions arranged consecutively; when the pixel isolation region between the first pixel region and the second pixel region is defined as pixel isolation region A, and the pixel isolation region between the second pixel region and the third pixel region is defined as pixel isolation region B; and when an end portion of the groove arranged in the pixel isolation region A at the second pixel region side is projected from the first pixel region to the second pixel region in a line direction of the main bank,
   the whole projection of the end portion overlaps the auxiliary bank in the pixel isolation region B.

2. The organic EL light-emitting device according to claim 1,
   wherein each of the pixel isolation regions includes one auxiliary bank,
   the auxiliary bank arranged on the pixel isolation region A is connected only to one of the opposing main banks, and the auxiliary bank arranged on the pixel isolation region B is connected only to the other of the opposing main banks, and
   a length of the auxiliary bank arranged in each of the pixel isolation regions in a direction perpendicular to the line direction is equal to or larger than ½ of a length of the color emission region in a minor axis direction.

3. The organic EL light-emitting device according to claim 1,
   wherein each of the pixel isolation regions includes a first auxiliary bank and a second auxiliary bank,
   the first auxiliary bank is connected only to one of the opposing main banks, and the second auxiliary bank is connected only to the other of the opposing main banks,
   a position of the first auxiliary bank in the line direction is different from a position of the second auxiliary bank in the line direction, and
   a length of the first auxiliary bank and the second auxiliary bank in a direction perpendicular to the line direction is equal to or larger than ½ of a length of the color emission region in a minor axis direction.

4. The organic EL light-emitting device according to claim 1,
   wherein each of the pixel isolation regions includes a first auxiliary bank, a second auxiliary bank, and a third auxiliary bank,
   the first auxiliary bank is connected only to one of the opposing main banks, and the second auxiliary bank is connected only to the other of the opposing main banks,
   the first auxiliary bank and the second auxiliary bank are opposing each other,
   the groove is arranged between the first auxiliary bank and the second auxiliary bank,
   a position of the third auxiliary bank in the line direction is different from positions of the first auxiliary bank and the second auxiliary bank in the line direction, and
   a position of the third auxiliary bank in a direction perpendicular to the line direction overlaps a position of the groove arranged between the first auxiliary bank and the second auxiliary bank.

5. The organic EL light-emitting device according to claim 1, wherein a height of the auxiliary bank is 0.05 to 1.0 times a height of the main banks.

6. The organic EL light-emitting device according to claim 1, wherein a hole injection layer is arranged between the pixel electrode and the organic function layer, and a material of the hole injection layer is a transition metal oxide.

7. The organic EL light-emitting device according to claim 6, wherein the transition metal oxide is selected from a group consisting of $WO_x$, $MoO_x$, $TiO_2$, $NiO$, $V_2O_5$ and $RuO_2$.

* * * * *